Figure 1:
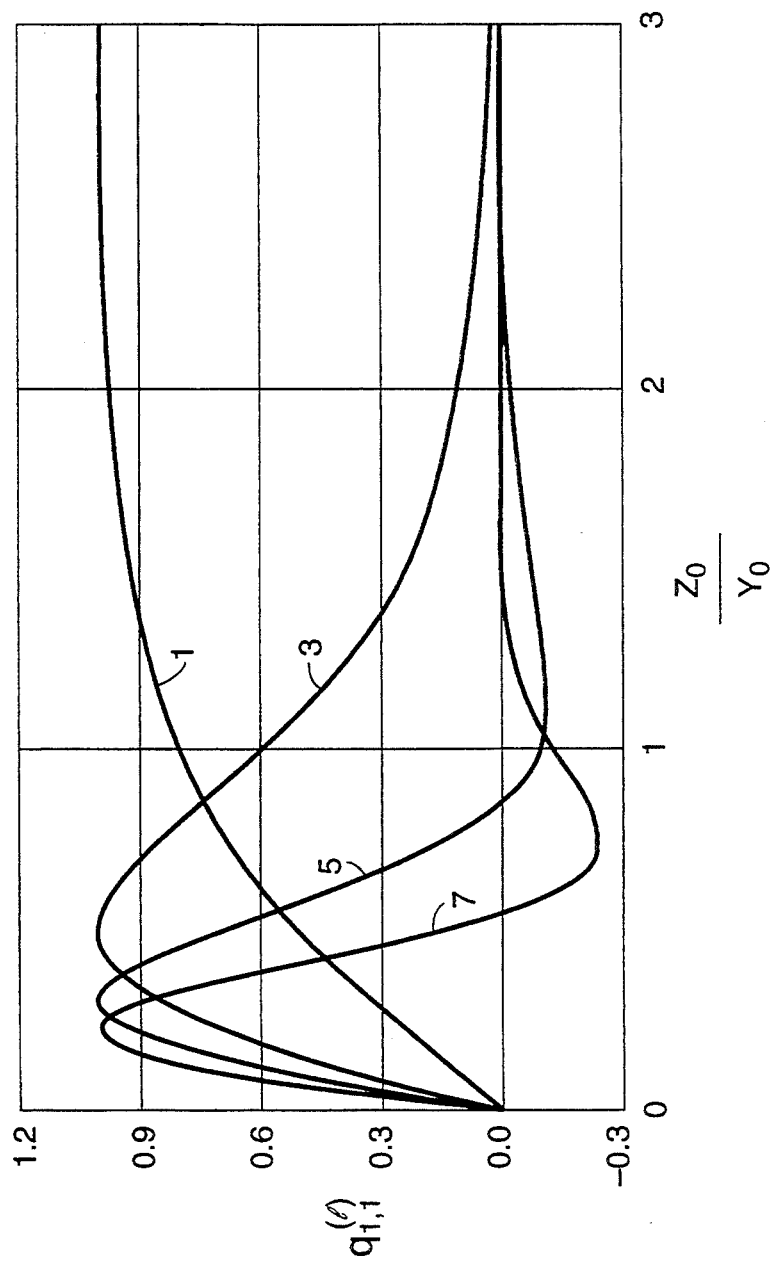

United States Patent [19]

Abele et al.

[11] Patent Number: 5,428,333
[45] Date of Patent: Jun. 27, 1995

[54] METHOD AND APPARATUS FOR COMPENSATION OF FIELD DISTORTION IN A MAGNETIC STRUCTURE

[75] Inventors: Manlio G. Abele, New York; Henry Rusinek, Great Neck, both of N.Y.

[73] Assignee: New York University, New York, N.Y.

[21] Appl. No.: 7,523

[22] Filed: Jan. 22, 1993

[51] Int. Cl.[6] .............................................. H01F 7/02
[52] U.S. Cl. ..................................................... 335/306
[58] Field of Search .............................. 335/296–306; 315/5.34, 5.35; 324/318, 319, 320

[56] References Cited

U.S. PATENT DOCUMENTS

| | | | |
|---|---|---|---|
| 4,580,098 | 4/1986 | Gluckstern et al. | 324/307 |
| 4,692,732 | 9/1987 | Leupold et al. | 335/302 |
| 4,703,276 | 10/1987 | Beer | 324/319 |
| 4,999,600 | 3/1991 | Aubert | 335/306 |
| 5,014,032 | 5/1991 | Aubert | 335/306 |
| 5,028,903 | 7/1991 | Aubert | 335/306 |
| 5,055,812 | 10/1991 | Abele et al. | 335/210 |
| 5,148,138 | 9/1992 | Miyata | 335/302 |

FOREIGN PATENT DOCUMENTS

| | | |
|---|---|---|
| 0431848A3 | 6/1991 | European Pat. Off. |
| 0467437A1 | 1/1992 | European Pat. Off. |
| 91/06963 | 5/1991 | WIPO |
| 92/22076 | 12/1992 | WIPO |

OTHER PUBLICATIONS

*IEEE Transactions on Magnetics*, vol. 28, No. 1, 1 Jan. 1992, New York U.S., pp. 931–934, M. G. Abele et al., 'Field Computation in Permanent Magnets'.

*IEEE Transactions on Magnetics*, vol. 26, No. 5, 1 Sep. 1990, New York U.S., pp. 1665–1667, M. G. Abele, 'Three-Dimensional Yokeless Magnets'.

Primary Examiner—Leo P. Picard
Assistant Examiner—Raymond M. Barrera
Attorney, Agent, or Firm—Rosen, Dainow & Jacobs

[57] ABSTRACT

A magnetic structure is provided having a pair of spaced apart magnetized elements having surfaces in a common plane that defines a wall of a cavity. The space between the first and second magnetized elements is formed with at least one slit extending perpendicularly to the common plane. In order to compensate for field distortion in the cavity, a magnetized element is provided in at least one of the slits, the material in the slit having a remanence that is different from the remanences of the spaced apart magnetized elements that define the structure. In modifications of the invention, the field distortion is compensated by including at least one component in the cavity that has a high magnetic permeability. This component has a variable thickness. It may be formed of a single component, or of a plurality of plates. In a still further embodiment, for a yokeless magnetic structure, field distortion compensation is effected by positioning magnetized elements outside of the magnetic structure. In a method for compensating for field distortion in a magnetic structure that defines a cavity, the magnetic field on a surface is measured to produce a map of the field on the surface. A plurality of points on the surface are projected to corresponding points on a second surface. A dipole is applied at each such point on the second surface that cancels perturbations of the magnetic field of the magnetic structure at the respective first point.

22 Claims, 18 Drawing Sheets

FIG. 4

| | 1.5 | 2.0 |
|---|---|---|
| $q_{1,1}^{(\ell)}$ | -1.6607 E-1 | -1.7535 E-1 |
| $y_0^2 \, q_{1,1}^{(3)}$ | 3.8501 E-3 | 1.5001 E-3 |
| $y_0^2 \, q_{1,1}^{(3)}$ | -8.5783 E-5 | -2.6398 E-5 |
| $y_0^4 \, q_{1,1}^{(5)}$ | 4.7356 E-4 | 1.6140 E-4 |
| $y_0^4 \, q_{3,1}^{(5)}$ | -8.2523 E-6 | -2.6537 E-6 |
| $y_0^4 \, q_{5,1}^{(5)}$ | 8.1990 E-9 | 3.7982 E-9 |
| $y_0^6 \, q_{1,1}^{(7)}$ | 4.7639 E-6 | 1.3167 E-5 |

FIG. 5

| $\dfrac{z}{y}$ | $\dfrac{z_{0,1}}{y_0}$ | $\dfrac{z_{1,2}}{y_0}$ | $\dfrac{z_{2,2}}{y_0}$ | $\tilde{H}$ |
|---|---|---|---|---|
| 2.0 | 0.66017 | 0.40167 | 0.59130 | 0.679 |
| 1.5 | 0.02547 | 0.45624 | 0.52779 | 0.869 |

FIG. 6

| No. cuts | ppm | $\tilde{H}$ |
|---|---|---|
| 0 | 13,935 | 0.956 |
| 1 | 7,031 | 0.927 |
| 3 | 1,067 | 0.869 |
| 5 | 177 | 0.521 |

FIG. 7

|  | 1.5 | 2.0 |
|---|---|---|
| $q_{1,1}^{(1)}$ | -4.8130 E-1 | -5.1864 E-1 |
| $y_0^2 \, q_{1,1}^{(3)}$ | 1.3324 E-2 | 6.3059 E-3 |
| $y_0^2 \, q_{1,1}^{(3)}$ | -2.3988 E-4 | -1.0353 E-4 |
| $y_0^4 \, q_{1,1}^{(5)}$ | 8.0638 E-4 | 4.7559 E-4 |
| $y_0^4 \, q_{3,1}^{(5)}$ | -1.2589 E-5 | -4.3454 E-6 |
| $y_0^4 \, q_{5,1}^{(5)}$ | -1.5520 E-7 | -4.3454 E-8 |
| $y_0^6 \, q_{1,1}^{(7)}$ | -5.0298 E-5 | 1.0208 E-5 |

FIG. 8

| $\dfrac{z_0}{y_0}$ | $\dfrac{z_{0,1}}{y_0}$ | $\dfrac{z_{1,2}}{y_0}$ | $\dfrac{z_{2,2}}{y_0}$ | $\tilde{H}$ |
|---|---|---|---|---|
| 1.5 | 0.12822 | 0.40381 | 0.77309 | 0.498 |
| 2.0 | 0.05911 | 0.48764 | 0.65522 | 0.768 |

FIG. 9

| No. cuts | ppm | $\tilde{H}$ |
|---|---|---|
| 0 | 19,106 | 0.938 |
| 1 | 7,571 | 0.885 |
| 3 | 603 | 0.770 |
| 5 | 63 | 0.556 |

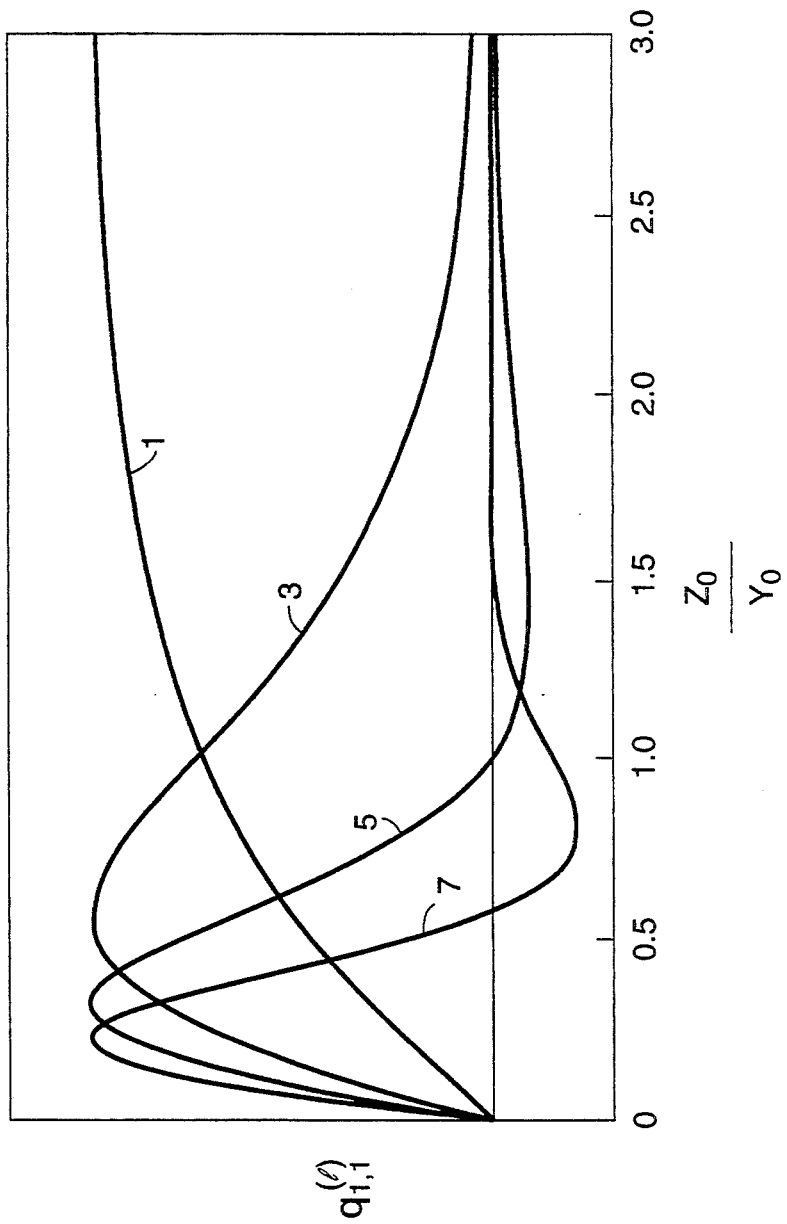

| No. inserts | $\dfrac{z_1}{y_0}$ | $\dfrac{z_2}{y_0}$ | ppm | $\tilde{H}$ |
|---|---|---|---|---|
| 0 | – | – | 19,106 | 0.938 |
| 2 | 1.3261 | 1.4705 | 1,229 | 0.992 |
| 4 | 0.2858 <br> 1.7106 | 0.2910 <br> 2.0000 | 170 | 1.02 |

| | No. Plate | Plates $S_1$, $S_2$ |
|---|---|---|
| $q_{1,1}^{(I)}$ | 1.7535 E-01 | 1.6248 E-01 |
| $y_0^2 q_{1,1}^{(3)}$ | -1.5001 E-03 | -3.1367 E-04 |
| $y_0^2 q_{3,1}^{(3)}$ | 2.6398 E-05 | -1.0323 E-05 |
| $y_0^4 q_{1,1}^{(5)}$ | -1.8140 E-04 | -1.0711 E-04 |
| $y_0^4 q_{3,1}^{(5)}$ | 2.6537 E-06 | 1.8750 E-06 |
| $y_0^4 q_{5,1}^{(5)}$ | -3.7982 E-09 | 1.3780 E-07 |
| $y_0^6 q_{1,1}^{(7)}$ | -1.3167 E-05 | -1.7431 E-05 |

METHOD AND APPARATUS FOR COMPENSATION OF FIELD DISTORTION IN A MAGNETIC STRUCTURE

FIELD OF THE INVENTION

This invention relates to the compensation of distortion in the field of a magnetic structure, and is more in particular directed to a magnetic structure employing such compensation, and a method for providing such compensation.

BACKGROUND OF THE INVENTION

Various known magnetic structures and techniques for designing such structures are disclosed, for example, in the technical reports "Generation of a Uniform Field in a Yokeless Permanent Magnet for NMR Clinical Applications", M. G. Abele and H. Rusinek, TR-19, NYU School of Medicine, New York, 1988 and "Optimum Designe of Two-Dimensionals Permanent Magnets", M. G. Abele, TR-21, NYU School of Medicine, New York, 1989, as well as in U.S. Patent applications Ser. Nos. 424,162, M. G. Abele, filed Oct. 19, 1989 (Case NYU127A), and 909,143, Abele et al, filed Jul. 6, 1992 (Case NYU130) and U.S. Pat. Nos. 5,107,239, Abele and 5,162,771, Abele. The contents of each of the above reports, patent applications and patents is incorporated herein by reference.

In a traditional design for a magnetic structure, the functions of generating and confining the field are assigned to separate components of a magnetic circuit. Such design starts with the specification of an assigned field within a given region of interest and the function of shaping the field is assigned to the ferromagnetic pole pieces. The region of interest in the structure is contained within the gap or cavity between the pole pieces whose shape is usually the most important part of the overall magnet design.

SUMMARY OF THE INVENTION

The present invention is directed to method and apparatus for compensating for field distortion in a magnetic structure. In accordance with one feature of the invention, a magnetic structure is provided having first and second spaced apart magnetized elements having surfaces in a common plane that defines a wall of a cavity. The cavity has at least one opening. The space between the first and second magnetized elements is formed as a slit extending perpendicularly to the common plane for compensating for field distortion resulting from the provision of said opening. A third magnetized element is provided in the slit for compensating for field distortion. The third element has a remanence that is different from the remanences of the first and second elements and that extends perpendicular to said plane. The first and second magnetized elements may the same remanence extending in a direction perpendicular to the common plane, or they may have different remanences extending in a direction perpendicular to the plane.

In this arrangement, the third magnetized element may have a remanence that is greater than that of the first and second magnetized elements, especially if it is desired to maintain the magnitude of the field in the cavity. Alternatively, the third magnetized element may have a remanence that is less that that of the first and second magnetized elements, especially if the first and second magnetized materials are of a material having the highest available remanence.

In modifications of this arrangement, if two or more slits are provided in the magnetic structure, the materials in the slits may be of the same magnetized material, the slits may be symmetrically placed in the structure, or at least one of the slits may be provided without a magnetized material therein.

In a further embodiment of the invention, the field distortion compensating means comprises at least one component having a high magnetic permeability positioned in cavity. This component, which may extend generally parallel to and adjacent one of said the first and second planes, has a dimension, in the direction perpendicular to the first and second planes, that varies in the direction parallel to the first and second planes.

In this arrangement, the component of high permeability may be a single component with a variable thickness, or it may be comprised of a plurality of components, such as plates. For example, it may be comprised of a first plate adjacent one of the walls of the cavity and having a first predetermined length, and at least one second plate on the side of the first plate away from the wall of the cavity and having a length shorter than that of the first wall. The second plate or plates may be parallel to the first plate, may be spaced therefrom or abutting the first plate, or may extend in a direction perpendicular to that of the first plate.

In this arrangement the plate or plates may be symmetrically arranged within the cavity, and the longer of the plates may be substantially coextensive with a wall of the cavity.

In a still further embodiment of the invention, for a yokeless magnetic structure, a field distortion compensating means comprises a pair of elements of magnetized material positioned on opposite sides of the magnetic structure. The pair of elements may be positioned at the axis of the structure. The remanence of the pair of elements extends in a direction to produce a field in the cavity that compensates for field distortion in of the field produced in the cavity by the magnetic structure. The pair of elements may have remanences that extend opposite to the direction of the field in the cavity that is produced by the magnetic structure.

In a still further embodiment of the invention, in a method for compensating for field distortion in a magnetic structure that defines a cavity, the magnetic field on a surface is measured to produce a map of the field on the surface. A plurality of points on the surface are projected to corresponding points on a second surface. A dipole is applied at each such point on the second surface that cancels perturbations of the magnetic field of the magnetic structure at the respective first point.

When the surface is a spherical surface, the step of measuring may comprise measuring the magnetic field on the surface of the sphere that has a center coincident with the nominal center of the field of the magnetic structure.

In a preferred embodiment of this method, the step of applying dipoles comprises applying dipoles having magnetic intensities that satisfy the system of equations:

$$\sum_{n_0}^{k=1} H^{(1)}_{h,k} p_k = -\delta H_h$$

-continued $$(h = 1, 2, 3 \ldots n_0)$$

where $p_k$ is the nondimensional value of the moment of the dipoles and coefficients $H_{h,k}^{(1)}$ are the y components of the intensities generated by the unit dipoles at points $P_h$.

BRIEF FIGURE DESCRIPTION

In order that the invention may be more clearly understood, it will now be disclosed in greater detail with reference to the accompanying drawings, wherein:

FIG. 1 Normalized coefficients $q_{1,1}^{(l)}$ versus $z_0/y_0$ for the yokeless magnet with a 3:2 rectangular cavity.

Figure 2A:
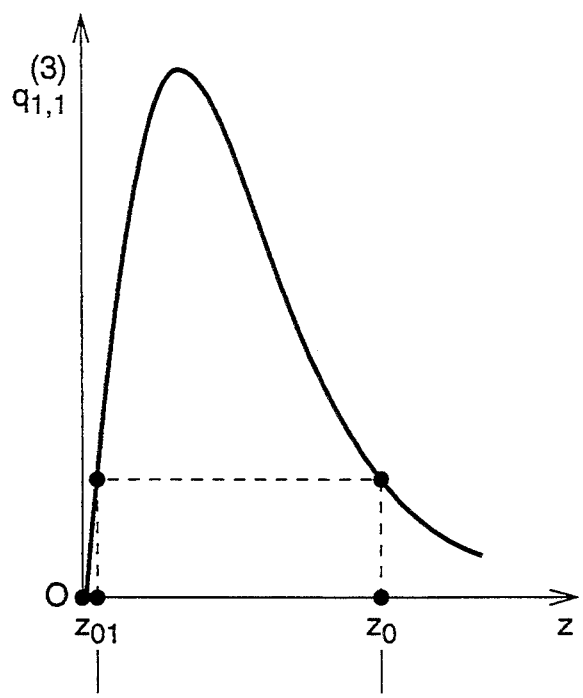
Figure 2B:
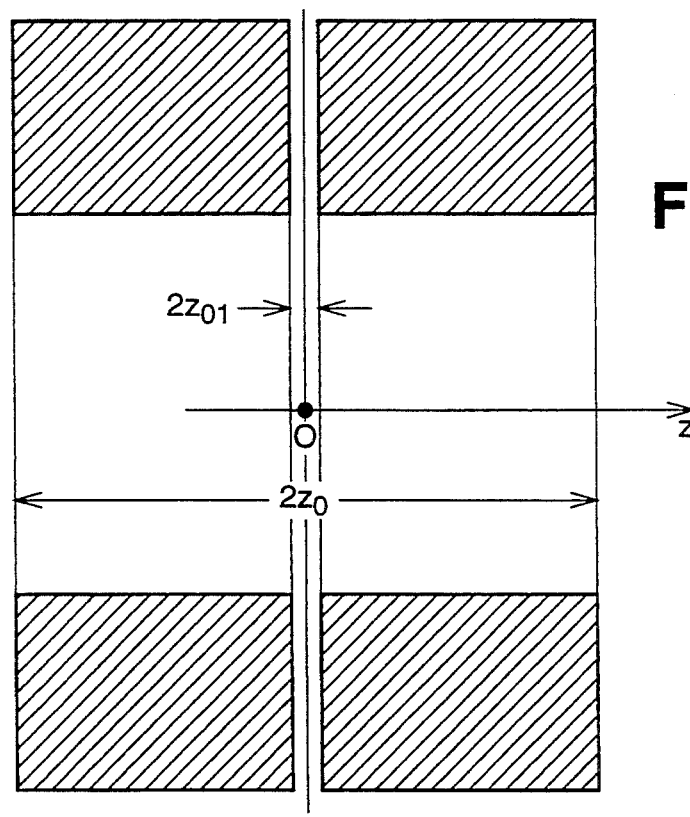

FIG. 2(a,b) Elimination of the $l=3$, $j=1$ harmonic.

Figure 3A:
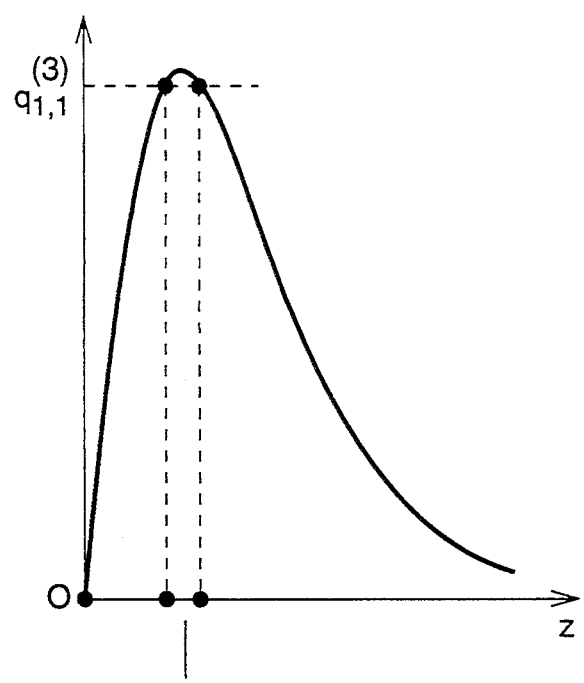
Figure 3B:
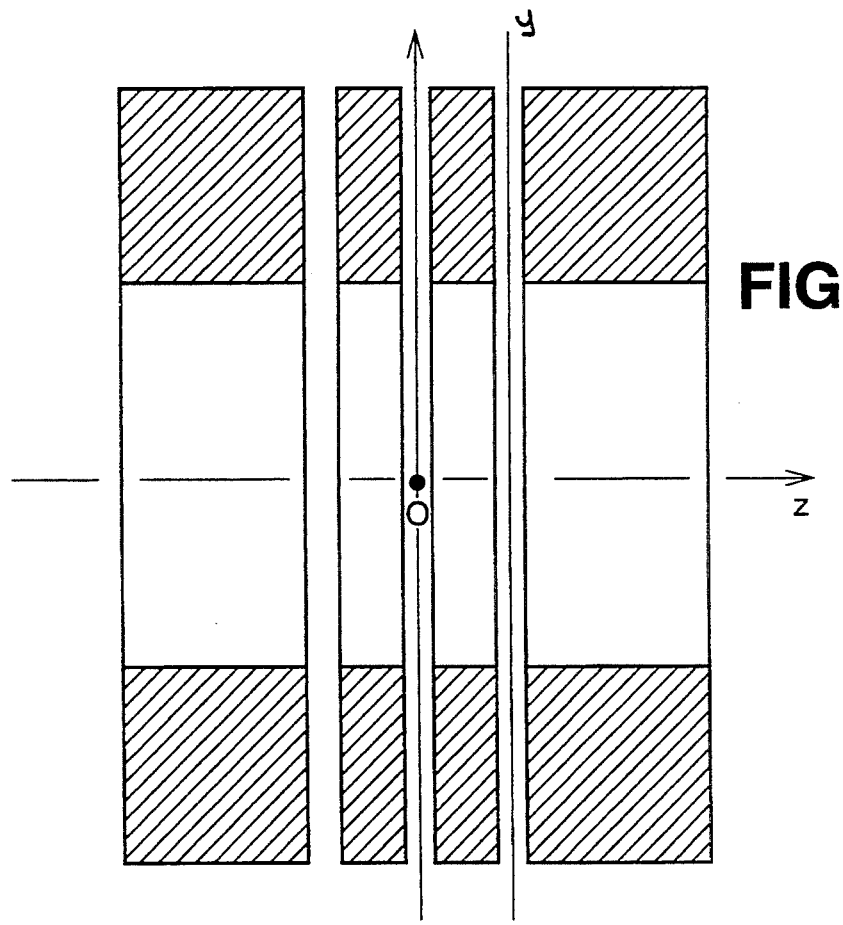

FIG. 3(a,b) Elimination of the $l=3$, $j=1$ and $l=5$, $j=1$ harmonics.

FIG. 4 Coefficients $q_{j,1}^{(l)}$ of the yokeless structure of FIG. 1 for $K_2=0.183$ and two values of length $z_0$.

FIG. 5 Position and dimensions of three cuts of the yokeless structure of FIG. 1 for the elimination of $l=3$, $j=1$ and $l=5$, $j=1$ harmonics. Listing of $\tilde{H}$.

FIG. 6 Uniformity in ppm for increasing number of cuts in the yokeless structure for $K_2=0.183$ and $z_0/y_0$ within a sphere of radius $\rho_i = y_0/2$.

FIG. 7 Coefficients $q_{j,1}^{(1)}$ of hybrid structure of two length $z_0$ and $K_1=0.55$.

FIG. 8 Position and dimension of three cuts of the $K_1=0.55$ hybrid structure for the elimination of $l=3$, $j=1$, and $l=5$, $j=1$ harmonics. Listing of $\tilde{H}$.

FIG. 9 Uniformity in ppm for increasing number of cuts in hybrid structure for $K_1=0.55$ and $z_0'=2y_0'$ within a sphere of $$\rho_i = \frac{1}{2} y_0 = \frac{1}{2.7} y'_0.$$

FIG. 10 Normalized coefficients

Figure 11A:
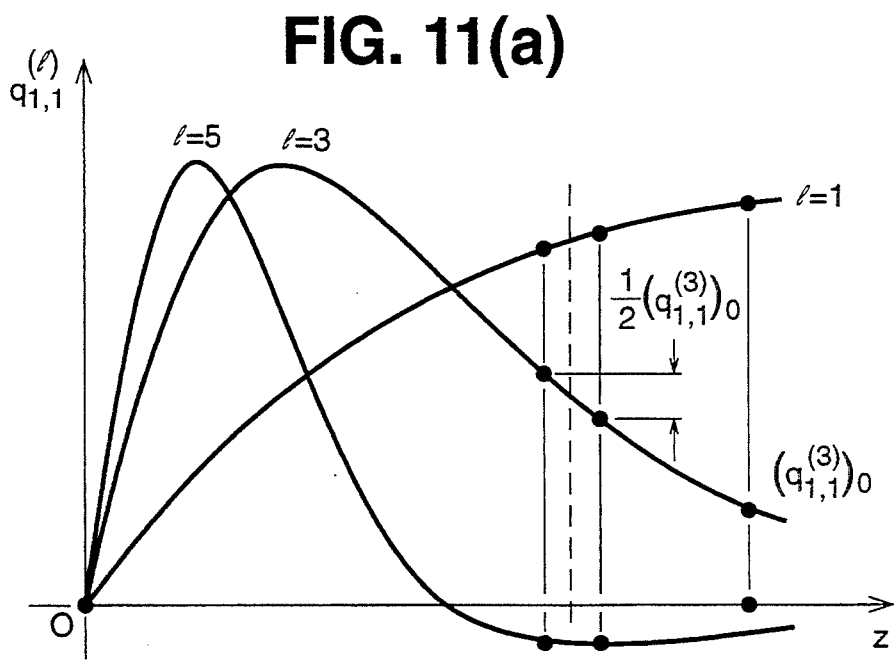
Figure 11B:
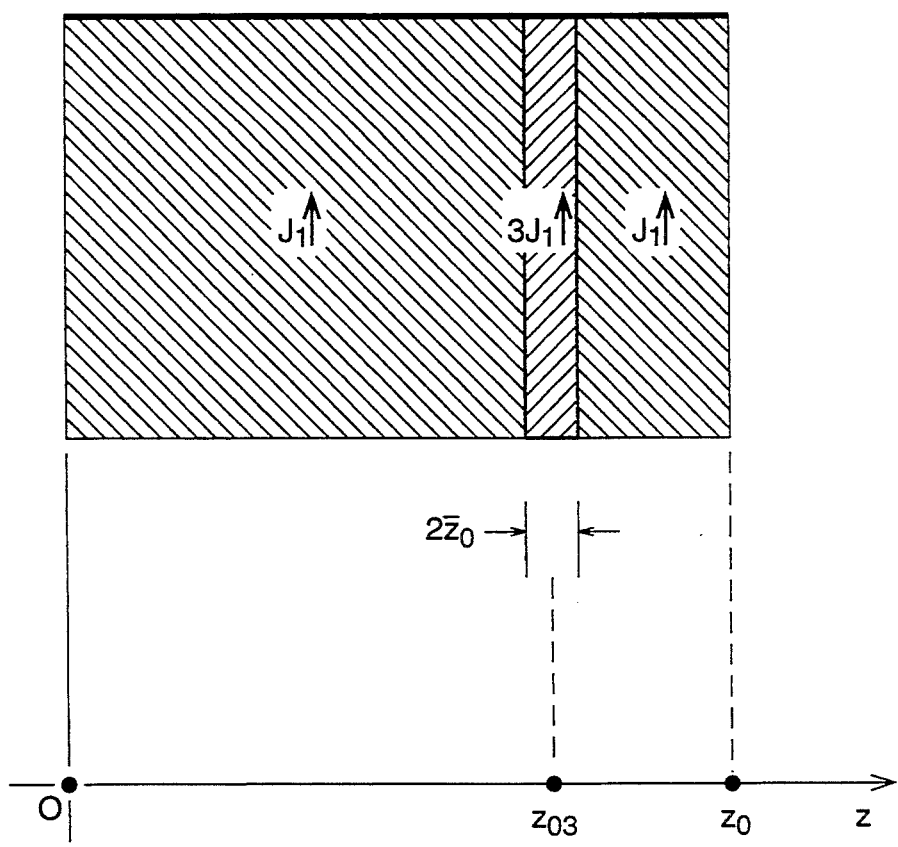
Figures 12, 13:
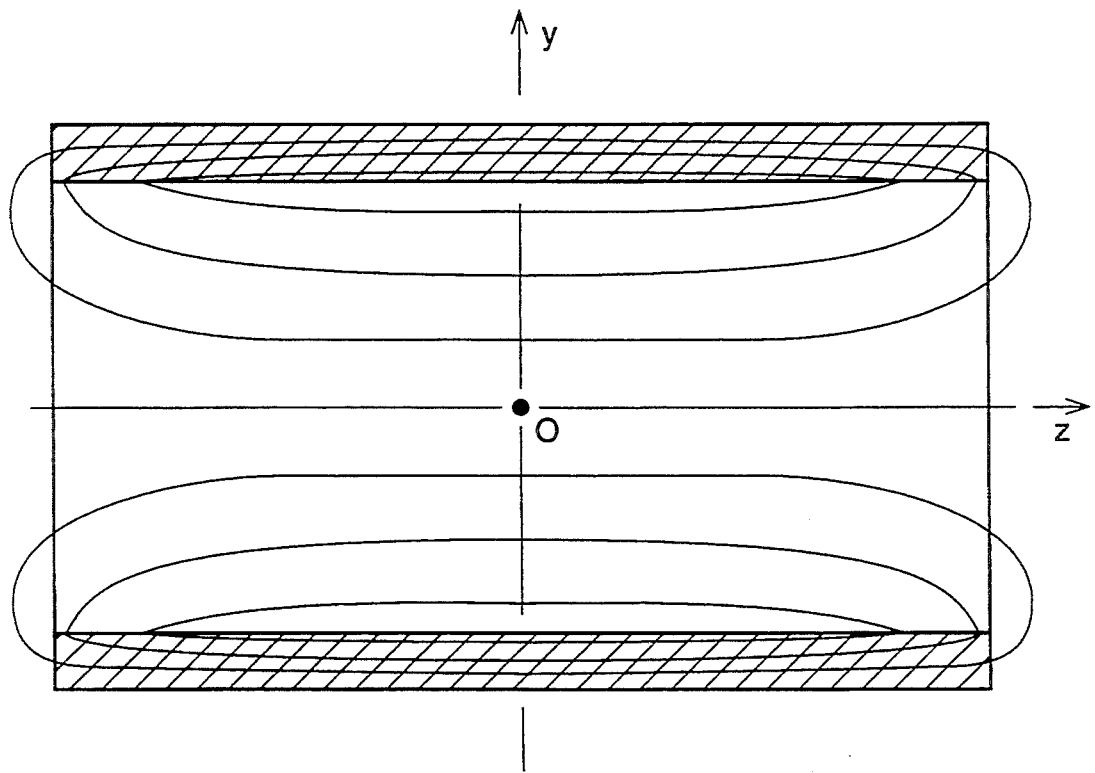

FIG. 11(a,b) Elimination of the $q_{1,1}^{(3)}$ harmonic by means of an insert of higher remanence material FIG. 12 Position and dimension of Nd. Fe. B inserts in a ferrite hybrid magnet of length $2z_0$ and $K_1=0.55$ to eliminate the $l=3$, $j=1$ and $l=5$, $j=1$ harmonics.

FIG. 13 Equipotential lines in the $x=0$ plane of the $K_1=0.183$ yokeless magnet.

Figure 14:
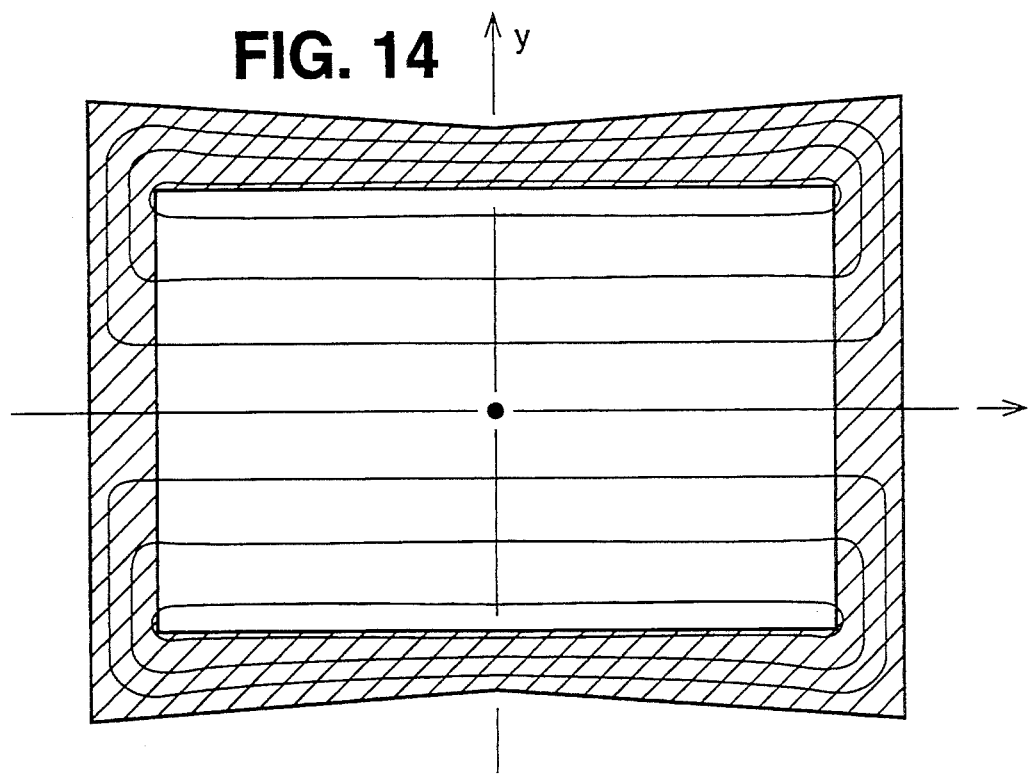

FIG. 14 Equipotential lines in the $z=0$ plane of the $K_1=0.183$ yokeless magnet.

Figure 15:
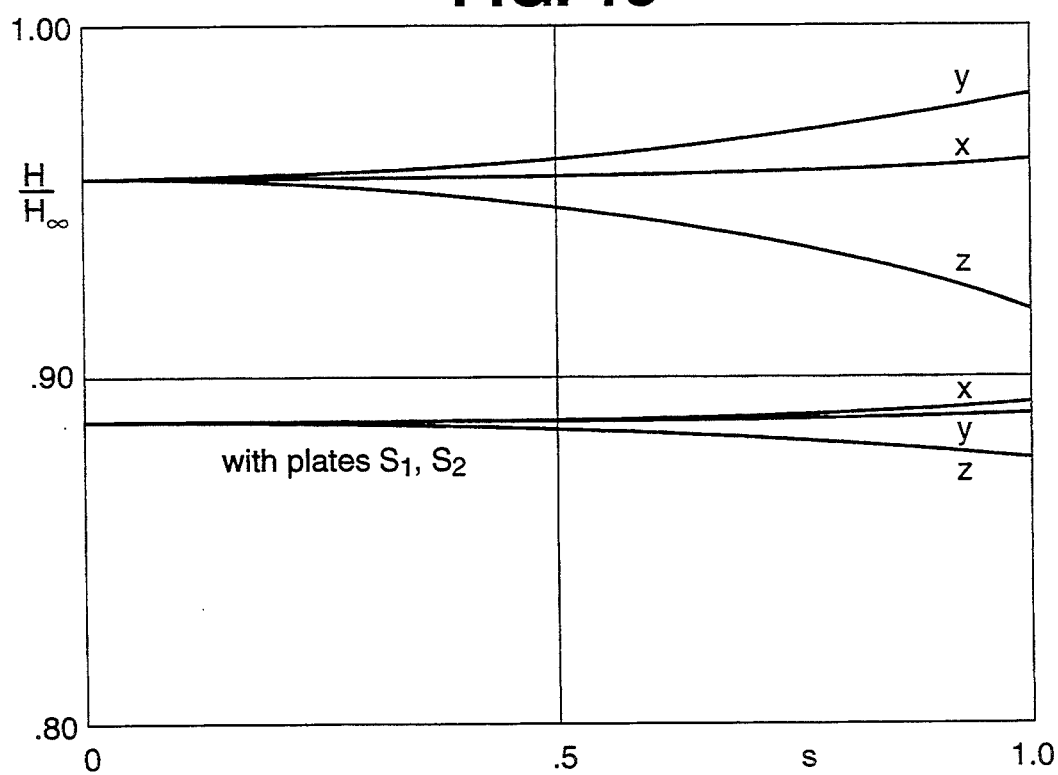

FIG. 15 Plotting of the field intensity on the three axes. The distances s from the center O are normalized to the dimension $Y_0$.

Figure 16:
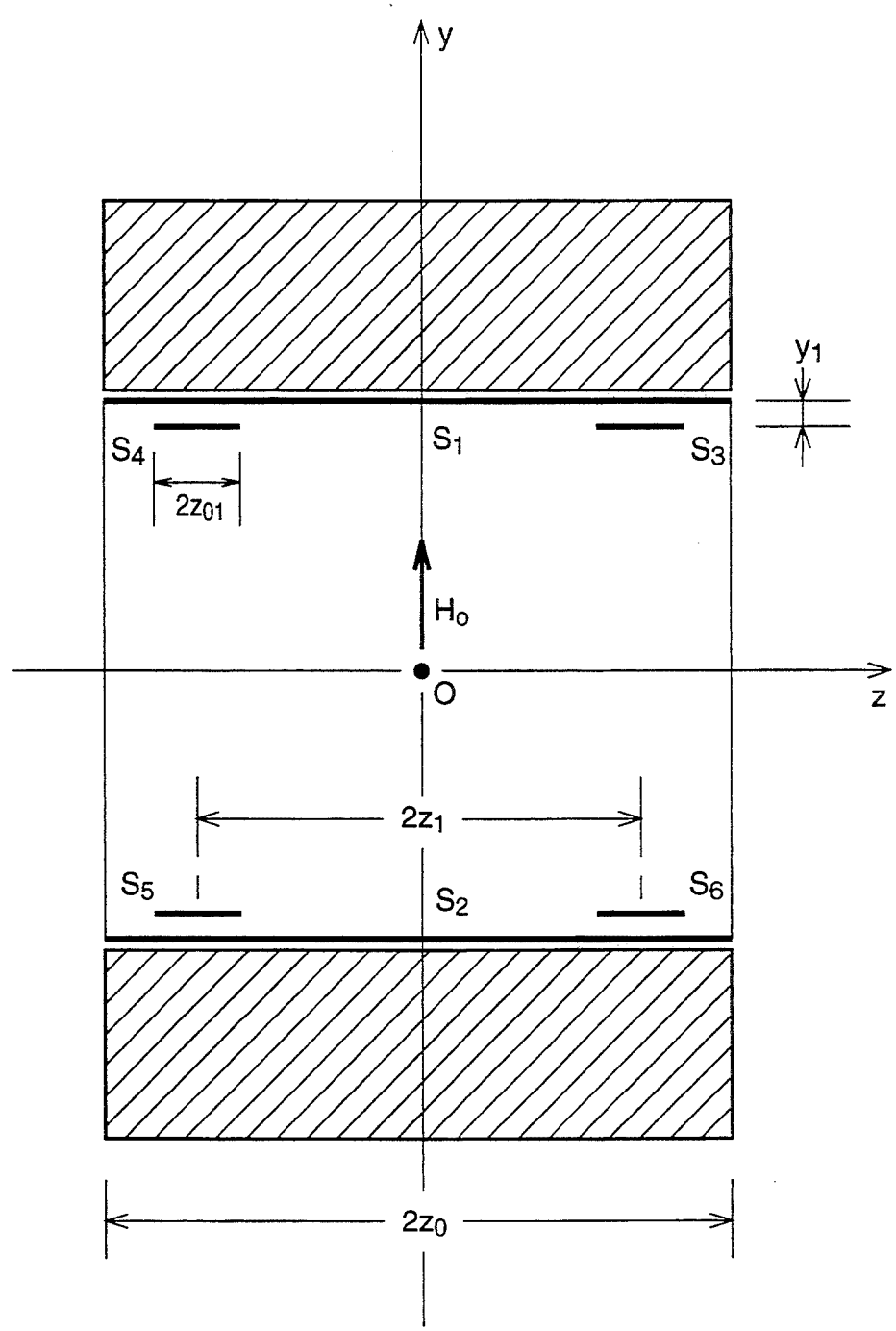

FIG. 16 Insertion of $\mu=\infty$ plates perpendicular to the y axis in the cavity of the magnet.

Figure 17:
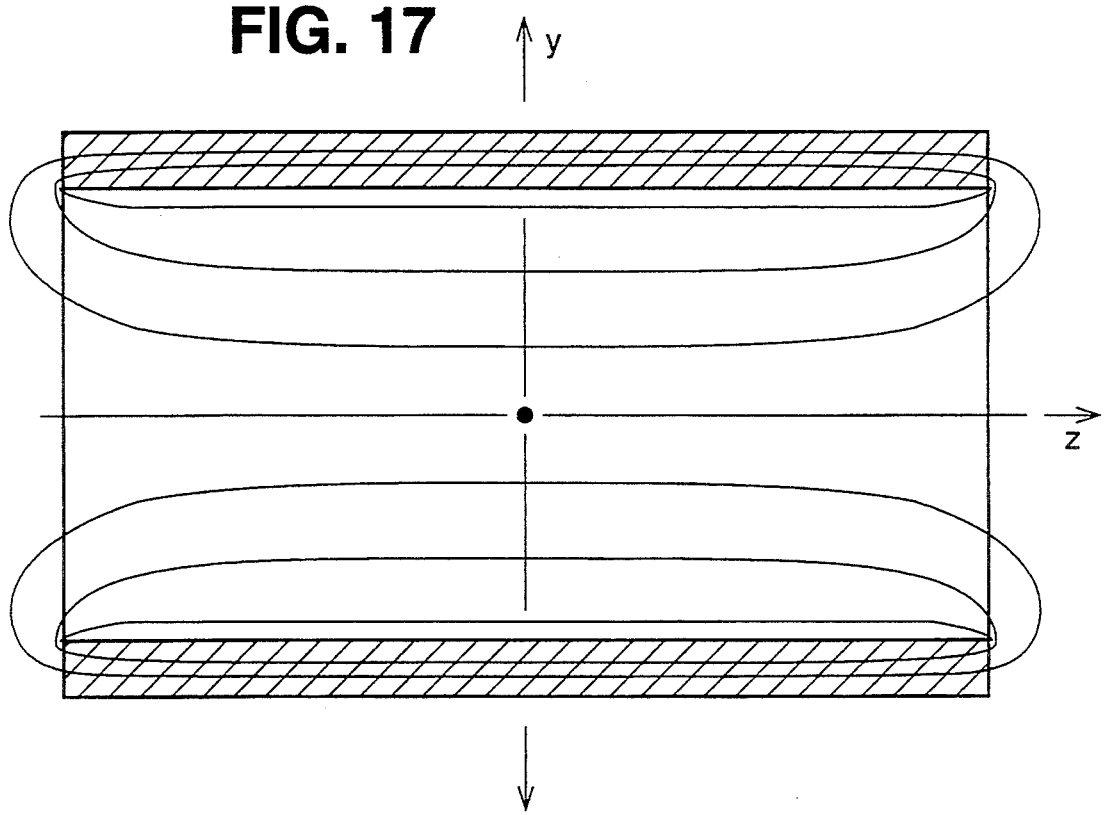

FIG. 17 Equipotential lines in the $x=0$ plane of the $K_2=0.183$ magnet in the presence of plates $S_1$, $S_2$.

Figure 18:
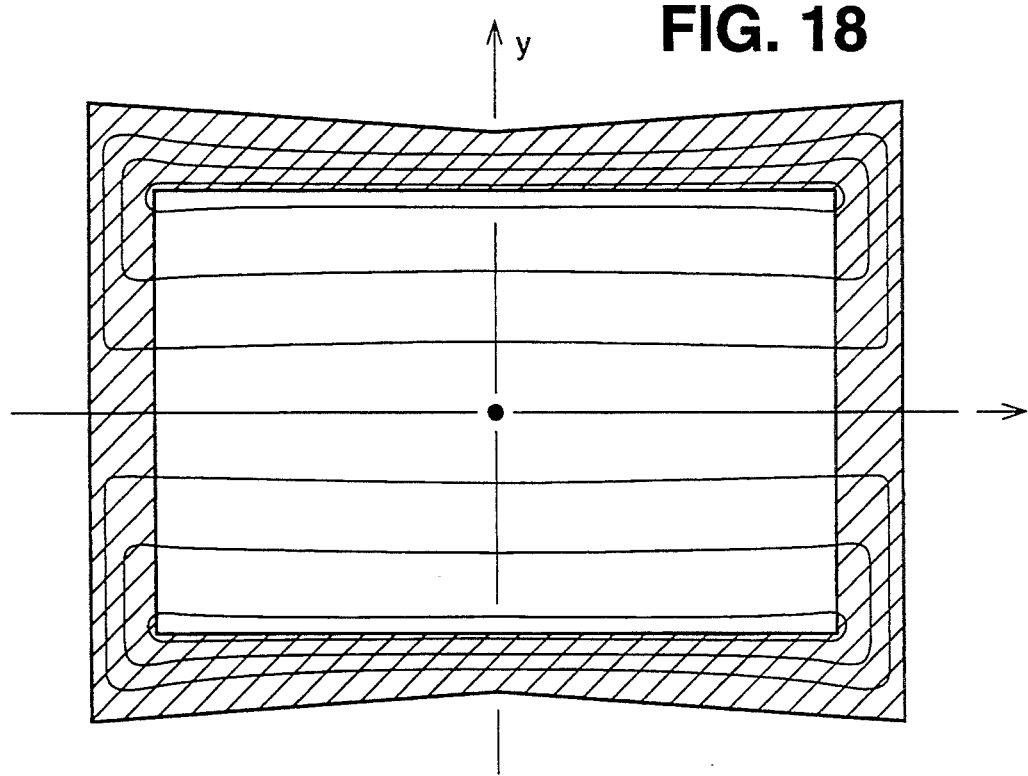

FIG. 18 Equipotential lines in the $z=0$ plane of the $K_2=0.183$ magnet in the presence of plates $S_1$, $S_2$.

Figure 19:
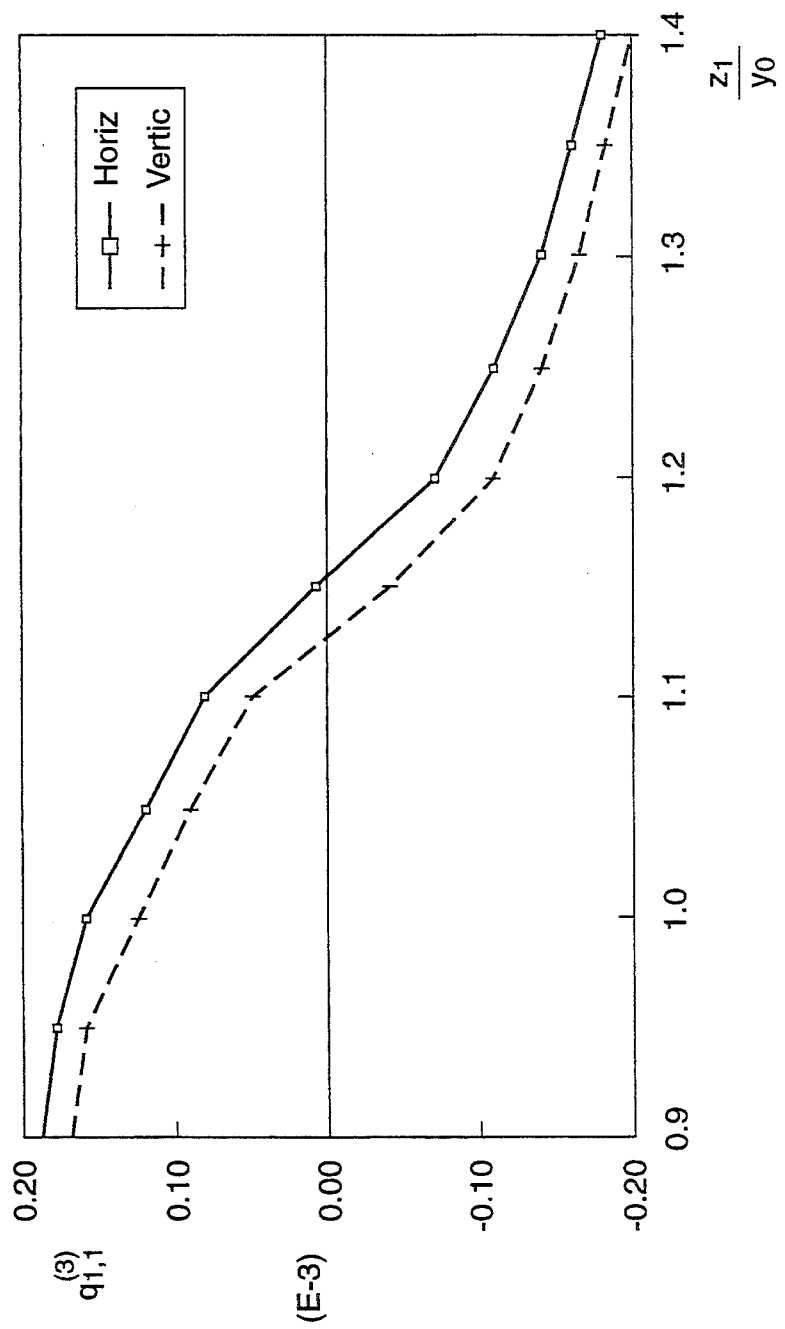

FIG. 19 Coefficient $q_{1,1}^{(3)}$ versus position of plates $S_3$, $S_4$, $S_5$, $S_6$.

Figure 20:
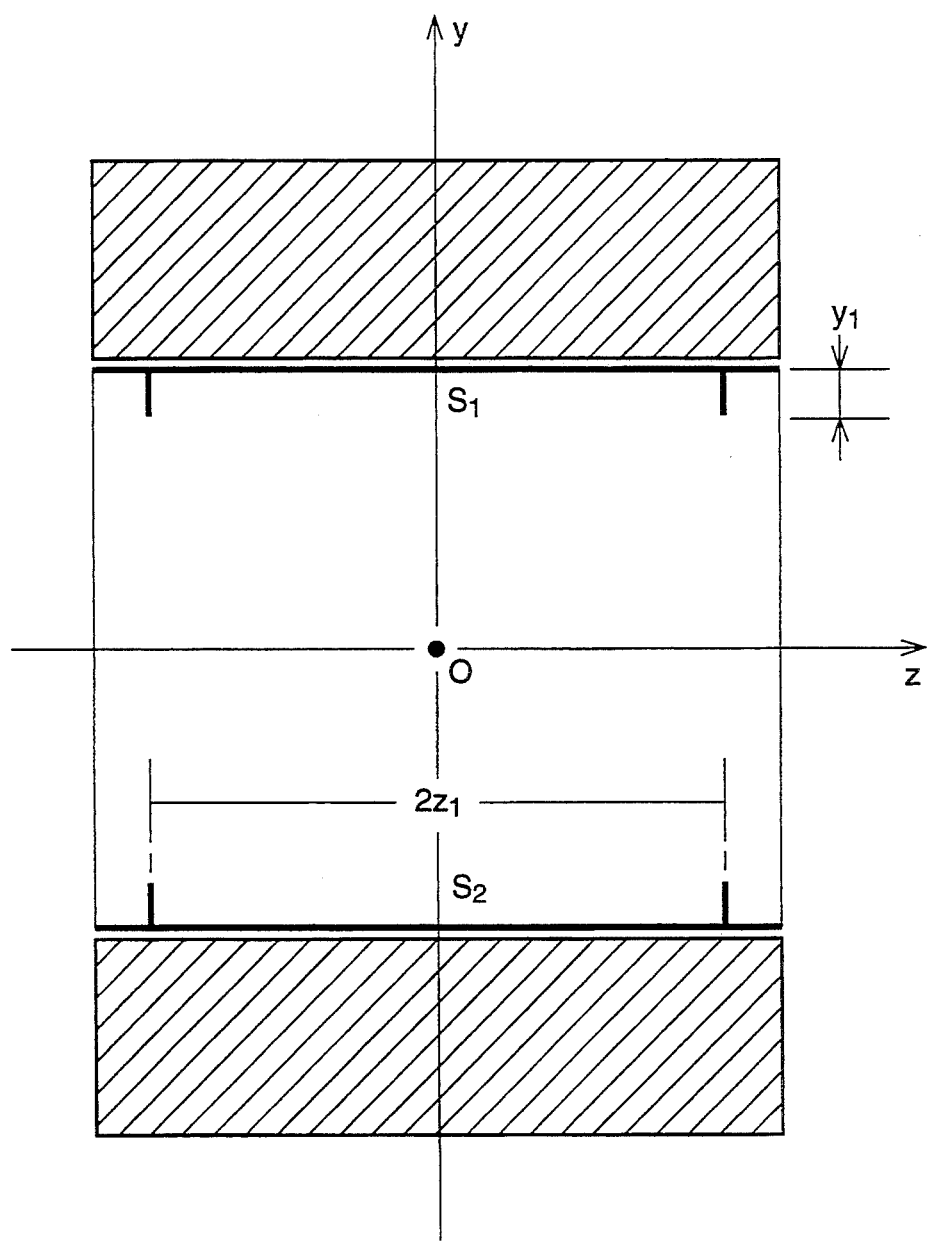

FIG. 20 Second set of surfaces $S_3$, $S_4$, $S_5$, $S_6$ perpendicular to S, and $S_2$.

Figures 21, 22:
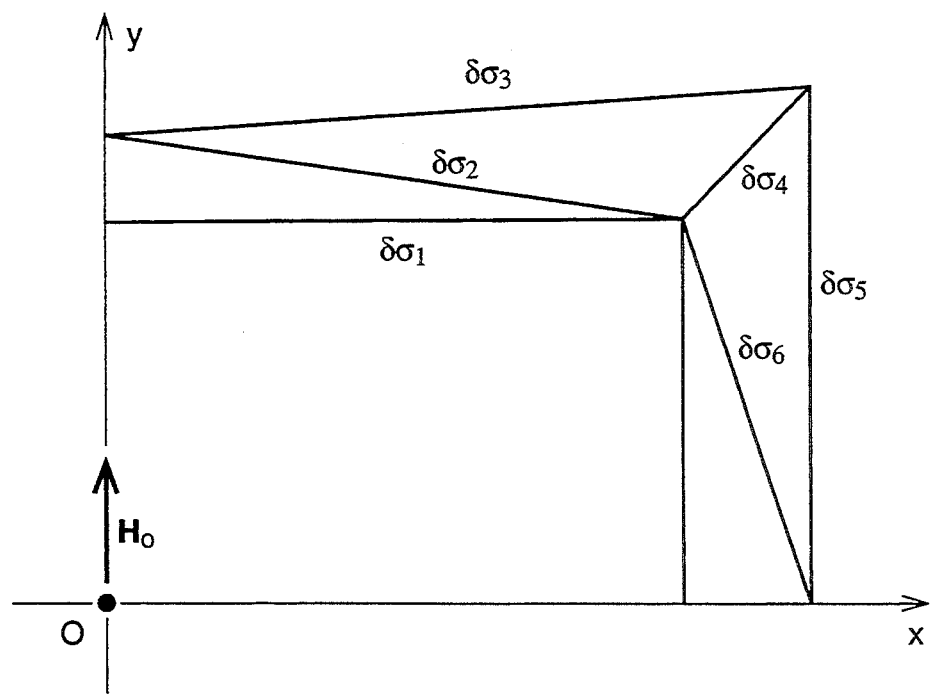

FIG. 21 Coefficient $q_{j,i}^{(l)}$ with and without plates $S_1$, $S_2$.

FIG. 22 Surface charges induced by $\chi_m$ in the $K=0.183$ yokeless magnet.

Figure 23:
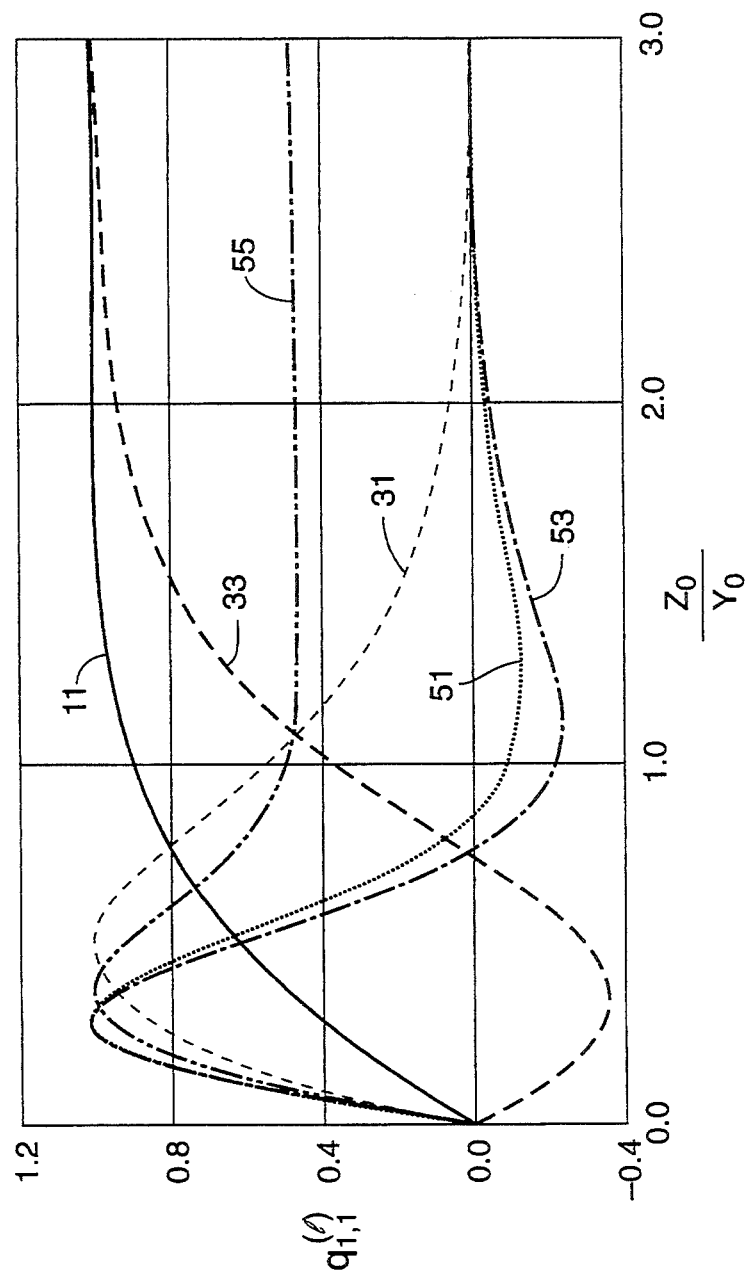

FIG. 23 Normalized coefficients $\delta q_{j,i}^{(l)}$ induced by $\chi_m$ versus $z_0/y_0$.

Figure 24:
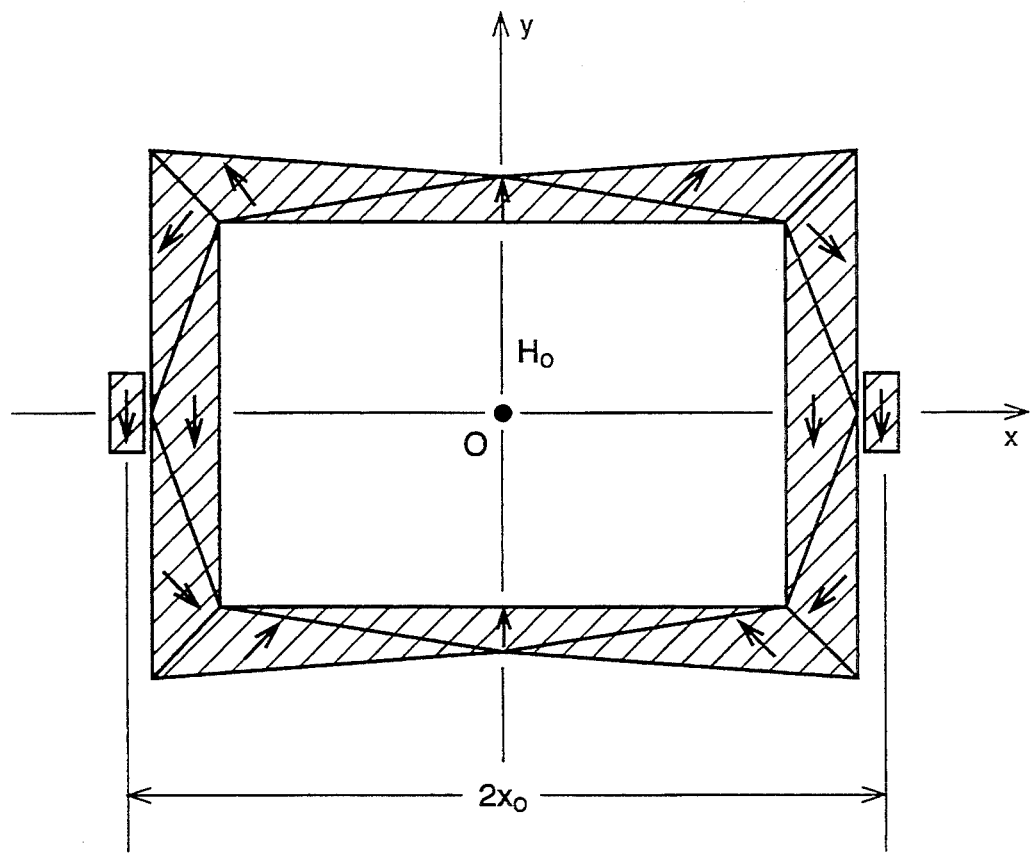

FIG. 24 Dipole distribution to cancel the $\delta q_{3,1}^{(3)}$ coefficient

Figure 25:
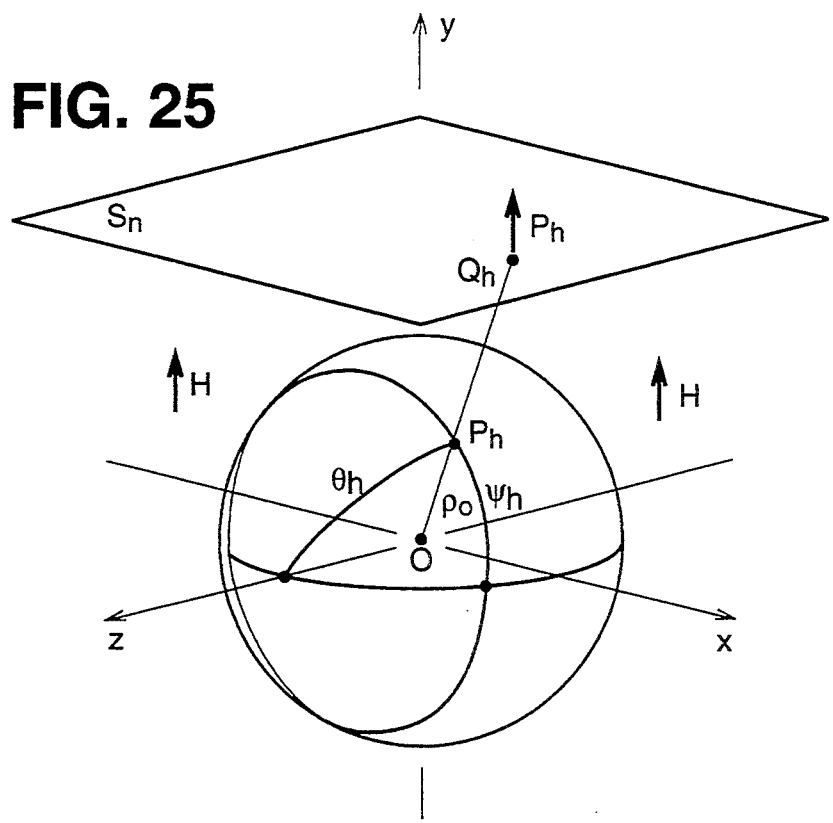

FIG. 25 Distribution shimming dipoles

Figure 26:
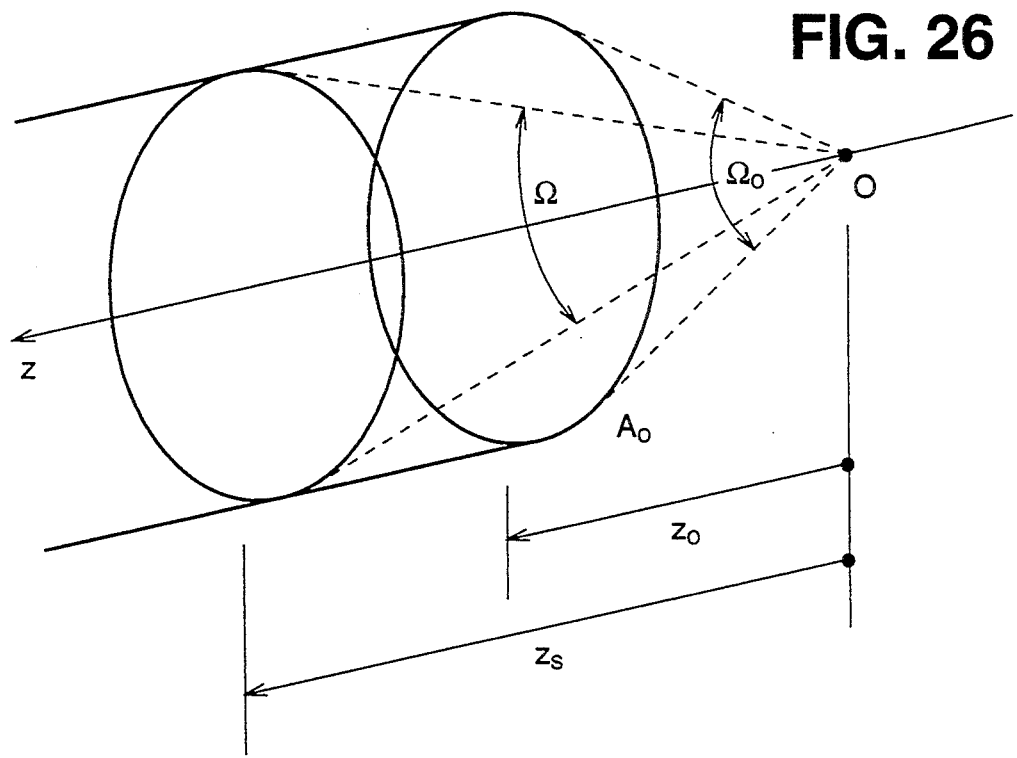

FIG. 26 Location of shimming dipoles outside the magnetic structure.

DISCLOSURE OF THE PREFERRED EMBODIMENTS OF THE INVENTION

The design of a magnet with the methodology, in accordance with the invention, is based on the specification of the field within an assigned closed cavity which is the region of interest. The design starts with the computation of an ideal magnetic structure that totally encloses the magnetic cavity. Then the design proceeds to adapt the ideal structure to the conditions imposed by practical constraints and materials. This conceptual difference from the traditional approach affects all aspects of design and fabrication of a magnet.

The best way to illustrate the design procedure is to select a geometry of the closed cavity and to proceed to the design of the different types of magnetic structures capable of generating an assigned field within it.

The selection of cavity geometry and field depends on the particular application. As an example, consider the design of a magnet for NMR clinical imaging where the minimum dimensions of the cavity are dictated by the size of the human body. The strength and the degree of uniformity of the field within the region of the body under scrutiny are selected on the basis of the diagnostic requirements. The degree of uniformity required by a medical application is of the order of tens of ppm and such a stringent requirement is the major problem facing the magnet designer.

Two levels of field strength are selected in the following sections to illustrate designs with materials with very different energy product levels like ferrites and rare earth alloys.

Compensation of Field Distortion Caused by Magnet Opening

The field inside the cavity can be analyzed by means of the spherical harmonic expansion of the scalar potential generated by the charges induced on the interfaces between the magnet components. The coefficients of the expansion provide the quantitative information about the field distortion within the region of interest which is the central region of the cavity. It has been shown that, in a square cross-section yokeless magnet, the field distortion depends upon the length of the magnetic structure. In principle the distortion can be reduced to any level if the magnet is made long enough. This is the simplest design approach which may be used in applications with moderate uniformity requirements. However, in a magnet designed for nuclear magnetic resonance imaging, a tolerable field distortion is measured in ppm and, if the dimensions of the region of interest and the dimensions of the cavity cross-section are of the same order, the length of the magnet would be exceedingly large. Thus special compensation techniques have to be introduced in the magnet design.

Consider first a yokeless rare earth magnet designed for the value $K_2=0.183$. Because of symmetry, within a sphere of radius $\rho_0 < y_0$ whose center coincides with the center of the magnet, the spherical harmonic expansion reduces to the terms with odd numbers l, j. FIG. 1 shows the plotting of coefficients $q_{1,1}^{(l)}$ of the $l=1,3,5,7$ terms of expansion for this structure. In the plotting of FIG. 1, the first maxima of coefficients $q_{1,1}^{(l)}$ are normalized to unity, and the length of the magnet $2z_0$ is normalized to the dimension $2y_0$ of the rectangular cavity cross-section.

The $l=j=1$ term provides the field at the center of the magnet. The finite length of the open magnet not only distorts the field but also reduces the field strength at the center of the region of interest. All $l>1$ coefficients vanish for $z_0/y_0 \to \infty$. Thus as the length of the magnet increases, the distortion terms become smaller and smaller, and the field close to the center becomes more and more uniform. It can be shown that, for large values of $l$, the amplitude of the distortion terms increases rapidly as the distance $p$ from the center increases. The goal of the designer is the elimination of the dominant harmonics to the extent that the desired degree of uniformity is achieved within a given distance $p_0$ from the center of the region of interest. The difficulty of eliminating the unwanted harmonics increases as the length $2z_0$ of the magnet decreases. Hence the compensation of the field distortion is a compromise between the choice of a minimum length of the magnet and a practical implementation of the compensation procedure.

The designer may follow two independent approaches: modify the distribution of the magnetized material or insert passive components of ferromagnetic material that become polarized by the field of the magnet.

The simplest way of eliminating the $q_{1,1}^{(l)}$ coefficients by modifying the distribution of the magnetized material is suggested by the observation that, for each value of $l>1$, it is always possible to select at least two different lengths of the magnet that exhibit the same value of $q_{1,1}^{(l)}$.

Consider for instance coefficient $q_{1,1}^{(3)}$ that has a single maximum as shown in FIG. 1. It is possible to select two different magnet lengths $2z_0$, $2z_{0,1}$ that exhibit the same value of $q_{1,1}^{(3)}$ as indicated in FIG. 2. If $z_0$ is sufficiently large, so that the value of $q_{1,1}^{(3)}$ is small compared to its maximum, the value of $z_{0,1}$ is also small compared to $z_0$. If the two magnets of lengths $2z_0$, $2z_{0,1}$ have equal and opposite remanences, and they are superposed to each other in such a way that they have center O in common, the total value of $q_{1,1}^{(3)}$ is zero and the $l=3$, $j=1$ harmonic is eliminated. If $z_{0,1} << z_0$, the superposition of the two magnets is equivalent to a cut of width $2z_{0,1}$ in the plane $z=0$, as indicated in the schematic of FIG. 2.

The cancellation of the $l=3$, $j=1$ harmonic usually results in an increase of the amplitude of the higher order harmonics, and as a consequence, the design must include the compensation of several harmonics of increasing order. The procedure adopted in FIG. 2 can be extended for instance to the cancellation of the $l=5$, $j=1$ harmonic as long as it is done without re-introducing the $l=3$, $j=1$ harmonic. This can be accomplished by means of two additional cuts, in the planes located on the opposite sides of the point where $q_{1,1}^{(3)}$ attains its maximum value, as indicated in FIG. 3. Likewise, additional cuts result in the elimination of increasingly higher order harmonics. Because $q_{1,1}^{(1)}$ increases monotonically with the length of the magnet, the elimination of each harmonic results in a decrease of the field within the region of interest, which can be compensated in the design phase by selecting either a higher value of the parameter K or a longer magnet.

FIG. 4 presents the values of coefficients $q_{j,1}^{(l)}$ for two lengths of the yokeless structure of FIG. 9.1.1$b$ designed for $K_2=0.183$. FIG. 4 shows that the short magnet ($z_0=1.5\ y_0$) exhibits a lower value of $q_{1,1}^{(1)}$ and significantly larger values of coefficients $q_{j,1}^{(l)}$ for $l \ne 1$. Thus wider cuts are necessary to eliminate the line $l \ne 1$ coefficients and, as a consequence, the elimination of each harmonic in the short magnet results in a much larger reduction of the field within the region of interest. For instance the elimination of the $l=3$, $j=1$ and $l=5$, $j=1$ harmonics with the three cuts defined in the schematic of FIG. 3 requires the dimensions and positions of the cuts listed in FIG. 5 for the two values of $z_0$. Coordinates $z_{1,2}$, $z_{2,2}$ are the distances of the boundaries of the additional cuts in FIG. 3 from the plane $z=0$. Also shown in FIG. 5 is the value $\tilde{H}$ of the field intensity at the center relative to the asymptotic value of the intensity for $z_0=\infty$. $\tilde{H}$ in FIG. 6 is defined as $$\tilde{H} = \frac{q_{1,1}^{(1)}}{(q_{1,1}^{(1)})_{z_0=\infty}} \tag{1}$$

The change of the magnitude of the field within the region of interest, rather than the change of its orientation, is of importance for NMR imaging. In the case of a highly uniform field oriented in the direction of the axis y of the structures the magnitude of the field reduces to the magnitude of its y component. Thus the field uniformity can be defined quantitatively by $$\delta = \left| \frac{(H_y)_{max} - (H_y)_{min}}{(H_y)_{avg}} \right| \tag{2}$$

where $(H_y)_{avg}$ is the average value of $H_y$ within the region of interest, and $(H_y)_{max}$, $(H_y)_{min}$ are the maximum and minimum values of $H_y$ within the same region. $\delta$ is usually measured in ppm (parts per million).

Define for instance the region of interest as the volume of a sphere concentric with the center of the magnet and radius $$\rho_i = \frac{1}{2} y_0 \tag{3}$$

The values of $\delta$ within the sphere of radius 9.2.3, are listed in FIG. 6, for increasing numbers of cuts.

Consider now the field within the cavity of the ferrite hybrid magnet of a magnet designed for $K_1=0.550$. The hybrid magnet has a length $2z_0'$ and is assumed to be open at both ends. Again consider the field within a sphere of radius $\rho_1 < y_0$ whose center coincides with the center of the magnet. FIG. 7 shows the plotting of coefficients $q_{1,1}^{(l)}$ of the $l=1,3,5,7$ terms of the expansion of the scalar potential. The two plotting of FIGS. 1 and 7 are similar to each other. A significant difference however is found in the normalized value of $q_{1,1}^{(1)}$. One observes that $q_{1,1}^{(1)}$ in FIG. 1 approaches its asymptotic value faster than in FIG. 7. This is due to the larger transverse dimensions of the magnetic structure of the hybrid magnet designed for $K=0.550$. The higher value of K requires a longer magnet to maintain the same relative reduction of the field at the center of the magnet.

The coefficients $q_{j,1}^{(l)}$ of the hybrid magnet are presented in FIG. 7 for the lowest values of $l$, and two values of the length $2z_0$. The approach of eliminating the $l>1$ coefficients by means of a series of cuts of the magnetic structure can be used for the hybrid magnet also. For instance, FIG. 8 shows the dimensions and positions of three cuts in a ferrite structure designed to eliminate the l=3, j=1 and l=5, j=1 harmonics. The value of δ for increasing number of cuts are listed in FIG. 9.

In the two layer structure described above, the dimensions $2x_0'$, $2y_0'$ of the rectangular cross section of the cavity of the external hybrid layer are related to the dimensions $2x_0$, $2y_0$ of the magnet cavity by $$2x_0' \approx 3.66 y_0, \quad 2y_0' \approx 2.7 y_0 \quad (4)$$

Assume that the region of interest of the two layer structure is the same sphere defined by FIG. 6. The sphere occupies a smaller fraction of the volume of the cavity of the hybrid layer. Thus for equal values of coefficients $q_{j,1}^{(l)}$ of internal and external layers, the external layer generates a more uniform field within the region of interest, as shown by FIG. 9 that lists the values of δ of the hybrid layer.

The compensation of the field distortion by means of cuts of the magnetic structure can be generalized to the use of materials with different remanences. For instance, the insertion of high energy product components may provide a way to compensate the field distortion in a magnet built with a lower energy product material.

As an example, consider again the hybrid magnet built with material of remanence line $J_1$ and let $(q_{1,1}^{(3)})_0$ be the value of coefficient $q_{1,1}^{(3)}$ for the magnet of length $2z_0$ as indicated in FIG. 8. Following the same rationale that has resulted in the structure of FIG. 2, it is possible to select another short magnet of length $2\bar{Z}_0$ positioned at $$z = z_{0,3} \quad (5)$$

magnetized in such a way as to generate a coefficient equal and opposite to $(q_{1,1}^{(3)})_0$. Assume for instance that the remanence $\vec{J}_1'$ of the short magnet is $$\vec{J}_1' = 2\vec{J}_1 \quad (6)$$

If the length $2\bar{z}_0$ is small compared to $2z_0$ and the position $2z_{03}$ is larger than the abscissa of the maximum value of $q_{1,1}^{(3)}$, the length $2\bar{z}_0$ is given by $$2\bar{z}_0 \left[ -\frac{d}{dz} q_{1,1}^{(3)} \right]_{z=z_{0,3}} \approx -\frac{1}{2} (q_{1,1}^{(3)})_0 \quad (7)$$

The superposition of the two magnets cancels coefficient $(q_{1,1}^{(3)})_0$, and by virtue of FIG. 9, it is equivalent to replacing the material of remanences $\vec{J}_1$ with a material of remanence $$\vec{J}_2 = 3\vec{J}_1 \quad (8)$$

which corresponds to the Nd.Fe.B alloy.

As shown in FIG. 8 the short section of remanence $\vec{J}_2$ may be located at the position of the minimum value of coefficient $q_{1,1}^{(5)}$, in which case the elimination of coefficient $q_{1,1}^{(3)}$ is achieved without affecting $q_{1,1}^{(5)}$. The procedure defined by the schematic of FIG. 8 can be extended to the elimination of increasingly higher order harmonics by replacing the $J_1$ remanence material at selected positions with short sections of material of remanence $J_2$.

FIG. 12 shows the dimension and position of the two inserts of remanence $J_2$ designed to eliminate the l=3, j=1 and the dimensions and positions of four slices designed to eliminate the l=3, j=1 and l=5, j=1 harmonics. Listed in the same Table are the corresponding values of δ.

An important difference exists between the approach of FIG. 8 and the compensation approach with cuts defined in FIG. 2. The elimination of each harmonic with the approach of FIG. 8 results in an additional increase of $q_{1,1}^{(1)}$ regardless of the position of the inserts of higher energy product material. FIG. 12 shows that the two Nd.Fe.B inserts practically restore the nominal value of the field intensity at the center of the magnet.

Compensation of Field Distortion with Ferromagnetic Materials

The correction of the field distortion discussed above is an example of shimming technique based on the use of active components consisting of elements of magnetized materials inserted in the magnetic structure. If the magnetized materials are rigid magnets transparent to the field of the structure, the designer enjoys the advantage that the shimming is not affected by the field of the magnet. A different situation is found in shimming techniques based on the use of elements of ferromagnetic materials inserted in the magnetic structure. These elements are polarized only the field of the magnet in a way that depends not only upon their geometry but also upon their position relative to the field.

If a thin $\mu = \infty$ layer is inserted in a magnetic structure, and if the layer follows an equipotential surface of the field generated by a closed magnet, it has no effect on the field. However, any field in which the layer is not an equipotential surface is affected by the presence of the layer. This shielding effect can be generalized to structures of high permeability layers designed to improve the uniformity of the field by filtering out the unwanted harmonics, generated by the opening of a magnet.

Consider again, for instance, the yokeless rare earth magnet of FIG. 9.1.1b designed for the value $K_2 = 0.183$, and assume a length $2z_0 = 4y_0$. The values of coefficients $q_{j,i}^{(l)}$ for the lowest order harmonics have been computed in FIG. 4. FIGS. 13 and 14 show the equipotential lines in the planes $x=0$ and $z=0$ respectively. The configuration of equipotential lines reflect the fact that within the cavity of the yokeless magnet discussed above with reference to FIG. 1, the field intensity decreases along the axis z, and it increases along axes x and y as the distances from the center of the magnet increase, as shown by FIG. 15 where the field intensity is plotted on the three axes. Both FIGS. 13 and 14, as well as 15, show that the 3:2 ratio of the x and y dimensions of the cavity results in a better uniformity of the field in the $z=0$ plane compared to the field configuration in the $x=0$ plane.

An improvement of the field uniformity can be expected by inserting two high permeability plates at the interfaces between magnetic material and cavity on the $y = \pm y_0$ planes. Ideally, assume that two $\mu = \infty$ rectangular plates $S_1$, $S_2$ of zero thickness are located on the $y = \pm y_0$ planes as indicated in the schematic of FIG. 16. The effect of the plates can be analyzed by applying a boundary integral equation method to the three-dimensional structure of the yokeless magnet of length $2z_0$. The surface charges σ on the two plates $S_1$, $S_2$, as well as the potentials of $S_1$, $S_2$ are provided by the numerical solution of the known systems. Then the values of $\sigma$ on all the interfaces of the three-dimensional structure are used to compute the scalar potential $\Phi$ by numerical integration of the equation $$\Phi = \frac{1}{4\pi\mu_0} \int \frac{\sigma}{\rho} ds \qquad (9)$$

Furthermore, the values of $\sigma$ are used in the numerical computation of coefficients $q_{j,i}^{(l)}$ of the spherical harmonic expansion of $\Phi$, for the quantitative analysis of the field properties within a spherical region of the magnet cavity with center at O.

The result of the numerical computation based on the system of equations 29 is presented in FIGS. 17 and 18 that show the equipotential lines in the planes $x=0$ and $z=0$, in the presence of the two plates $S_1$, $S_2$. The plotting of the field intensity on the three axes is shown in FIG. 15 and FIG. 20 shows that the insertion of the two plates results in a partial compensation of the field distortion at the expenses of a reduction of the field intensity at the center of the magnet.

The significant reduction of the value of coefficient $q_{3,1}^{(3)}$ in the presence of the two plates $S_1$, $S_2$, implies an improvement of the field uniformity in the x, y plane, as apparent by comparing the plottings of $H_y$ on the x and y axes in FIG. 15 with and without the plates. In the particular example above discussed with reference to FIG. 1, the presence of the two plates results in a field configuration within the region of interest that is very close to that generated by a two-dimensional structure of infinite length along the axis x. The results of FIG. 15 and FIG. 20 suggest that further improvement of the field uniformity in the $x=0$ plane can be achieved by modifying the geometry of the high permeability components only in the direction parallel to the axis z. Consider, for instance, the insertion within the cavity of a second $\mu = \infty$ layer of zero thickness in close proximity to the rectangular plates $S_1$, $S_2$. In the schematic of FIG. 16 the second layer consists of four rectangular plates $S_3$, $S_4$, $S_5$, $S_6$ symmetrically arranged with respect to the center of the magnet. The plates are assumed to have identical rectangular geometries with dimensions $2x_0, 2z_{0,1}$ and they are positioned at $z = \pm z_1$ at a distance $y_1$ from plates $S_1$ and $S_2$, as shown in FIG. 16.

FIG. 19 shows the value of coefficient $q_{1,1}^{(3)}$ versus the position $z_1$ of the four rectangular plates for a dimension $2z_{0,1}$ and a distance $y_1$:

The result of FIG. 19 is obtained by imposing the condition $$2z_{0,1} = 0.4y_0, \quad y_1 = 0.1y_0 \qquad (10)$$

$$\phi_3 = \phi_4 = \phi_1, \quad \phi_5 = \phi_6 = \phi_2 = -\phi_1 \qquad (11)$$

i.e. by assuming that plates $S_3$, $S_4$ are connected to $S_1$ and plates $S_5$, $S_6$ are connected to $S_2$. Then the charge distribution satisfies the condition $$\int_{S_1 + S_3 + S_4} \sigma ds = \int_{S_2 + S_5 + S_6} \sigma ds = 0 \qquad (12)$$

The cancellation of coefficient $q_{1,1}^{(3)}$ occurs at the position $z_1$ of the plates of the second layer:

$$z_1 = 1.15y_0 \qquad (13)$$

A similar result is obtained with the arrangement of FIG. 20 where the surfaces $S_3$, $S_4$, $S_5$, $S_6$ are perpendicular to surfaces $S_1$ and $S_2$. Again the two sets of surfaces are assumed to satisfy solution 15. The plotting of coefficients $q_{1,1}^{(3)}$ versus the position of surfaces $S_3$, $S_4$, $S_5$, $S_6$ is also shown by the dashed line in FIG. 19 for a dimension $y_1$ $$y_1 = 0.1y_0 \qquad (14)$$

0 and the cancellation of coefficients $q_{1,1}^{(3)}$ occurs at the position $$z_1 \approx 1.13y_0 \qquad (15)$$

Compensation of Field Distortion Caused by Non-zero Magnetic Susceptibility

The compensation techniques discussed in the previous sections are based on the assumption that the magnet opening is the dominant cause of the field distortion within the region of interest. This is certainly true in the majority of applications. However, as the uniformity requirements become more and more stringent, the elimination of the field harmonics generated by the opening gets to a point where the residual distortion of the field is due primarily to the real magnetic characteristics of the materials, and, in particular to the demagnetization characteristics. The analysis of the effect of a small non-zero value of the magnetic susceptibility $\chi_m$ has been previously developed.

To assess the magnitude of the effect of $\chi_m$ on the type of structures discussed in above, consider again a section of length $2z_0$ of the yokeless rare-earth magnet discussed above with respect to FIG. 1 and assume that the field distortion due to the opening has already been reduced to a small level by means of the compensating techniques described above. Then, in a first order approximation, if $\chi_m \ll 1$, the effect of $\chi_m$ can be determined by assuming that the magnetic material is polarized by the field computed in the perfect two-dimensional magnet of infinite length.

FIG. 21 shows the first quadrant of the magnet cross-section with the surface charge densities $\delta\sigma_k$ induced by the field. For $\chi_m \ll 1$, coefficients $q_{j,i}^{(l)}$ of the spherical harmonics expansion are $$q_{j,1}^{(l)} \approx [q_{j,1}^{(l)}]_{\chi_m=0} + \delta q_{j,1}^{(l)} \qquad (16)$$

where $\delta q_{j,i}^{(l)}$ are derived from the surface charge densities $\delta\sigma_k$ that result from the induced polarization of the magnetic material. It can be shown that $\delta\sigma_k$ are proportional to $\chi_m$ and fork $K = 0.183$ their values are $$\begin{cases} \delta\sigma_1 \approx 0.707\chi_m J_2, & \delta\sigma_2 \approx -0.160\chi_m J_2, & \delta\sigma_3 \approx -0.555\chi_m J_2 \\ \delta\sigma_4 \approx 0.779\chi_m J_2, & \delta\sigma_5 \approx \delta\sigma_3, & \delta\sigma_6 \approx 0.650\chi_m J_2. \end{cases} \qquad (17)$$

The normalized values of coefficients $\delta q_{j,i}^{(l)}$ for $l = 1, 3, 5$ are plotted in FIG. 22 versus the normalized value of $z_0$. Coefficients $l = j > 1$ reflect the most significant effect of the non-zero value of the magnetic susceptibility. All terms $l > 1$ of the field computed in the ideal limit $\chi_m = 0$ vanish for $z_0 \to \infty$. This is not true any longer for $\chi_m \neq 0$ as shown by the plotting of $q_{3,1}^{(3)}$ and $q_{5,1}^{(5)}$ in FIG. 22. The contributions of the individual charges $\delta\sigma_k$ do not cancel each other asymptotically and one has $$\begin{cases} \lim_{z_0 \to \infty} \delta q_{1,1}^{(1)} \approx +1.54 \chi_m J^2 \\ \lim_{z_0 \to \infty} \delta q_{3,1}^{(3)} \approx -7.39 \cdot 10^{-3} \chi_m J^2 y_0^{-2} \\ \lim_{z_0 \to \infty} \delta q_{5,1}^{(5)} \approx +8.33 \cdot 10^{-6} \chi_m J^2 y_0^{-4} \end{cases} \quad (18)$$

The non-zero limit of $\delta q_{1,1}^{(1)}$ results in a reduction $\delta\vec{H}$ of the field intensity at the center of the magnet:

$$\lim_{z_0 \to \infty} \delta\vec{H} \approx -0.123 \chi_m \frac{J^2}{\mu_0} \quad (19)$$

The asymptotic value of the $l=3$ term of the perturbation $\delta\Phi$ of the scalar potential is $$\lim_{z_0 \to \infty} \delta\phi_3 \approx -8.82 \cdot 10^{-3} \frac{\chi_m}{\mu_0} J_2 (y^2 - 3x^2) y \quad (20)$$

which corresponds to a perturbation $\delta H_y$ of the y component of the field intensity $$(\delta H_y)_{l=j=3} \approx 2.65 \cdot 10^{-2} \frac{\chi_m}{\mu_0} J_2 (y^2 - x^2) \quad (21)$$

Term (21) is independent of the z coordinate. Thus its compensation must be accomplished by means of an z independent distribution of sources located outside of the region of interest in order not to reintroduce a z dependent distortion. Assume for instance that two distributions of magnetic dipoles are added to the structure discussed with reference to FIG. 1 in the plane $y=0$ on the lines $x = \pm x_d$ as indicated in FIG. 23. The dipole distributions have a uniform dipole moment per unit length $\vec{p}_3$ oriented in the direction of the axis y. The y component $H_y$ of the field intensity generated by the two dipole distributions is given by $$H_{y,3} = -\frac{P_3}{2\pi\mu_0} \left\{ \frac{1}{[(x_d - x)^2 + y^2]^2} [(x_d - x)^2 - y^2] + \frac{1}{[(x_d + x)^2 + y^2]^2} [(x_d + x)^2 - y^2] \right\} \quad (22)$$

In a region close to the axis z such that $$r = (x^2 + y^2)^{\frac{1}{2}} << x_d \quad (23)$$

component (23) reduces to $$H_{y,3} \approx -\frac{P_3}{\pi\mu_0 x_d^2} \left[ 1 + \frac{3}{x_d^2} (x^2 - y^2) \right] \quad (24)$$

Thus close to the axis of the magnet, the field perturbation 9.4.6 is canceled if the dipole moment per unit length $\vec{p}_3$ is $$\vec{p}_3 = -8.8 \cdot 10^{-3} \pi \chi_m x_d^4 J_2 \vec{y}/y_0^2 \quad (25)$$

where $\vec{y}$ is a unit vector oriented in the direction of the axis y. In the schematic of FIG. 23 the two line distributions of magnetic dipoles are added outside of the structure of the yokeless magnet, where the field intensity is expected to be small compared to the intensity within the cavity. The dipole distribution can be implemented by means of two rods of a magnetic material of remanence $\vec{J}_3$ oriented parallel to the axis y, as indicated in FIG. 23. The area $A_3$ of the cross section of the rod is given by $$A_3 \vec{J}_3 \approx \vec{p}_3 \quad (26)$$

Thus for $\chi_m << 1$ of the same order of $\vec{J}_2$, Eqs (25) and (25) show that the rods have a cross sectional area small compared to the area of the magnetic structure.

Compensation of Magnetization Tolerances

The partial compensation of the field distortion caused by magnet opening and magnetic characteristics of the materials is a design problem that is solved by means of the approaches described above.

The fabrication tolerances, on the other hand, result in random patterns of the field distortion that change from magnet to magnet. The most important cause of the field distortion is due to the magnetization tolerances of the magnetized materials, whose remanence may change from point to point within the same material both in magnitude and in orientation as well.

In the fabrication of the above-described structures each component of these structures must be fabricated by machining and assembling a number of individual blocks of magnetic material. In a large magnet the dimensions of the magnetic structure are large compared to the size of the individual blocks. Thus the fabrication of these large magnets may require a number of blocks in the order of hundreds or even thousands. Each of the blocks may exhibit a slightly different value and orientation of its remanence. Variations of a few percent are normally found in the magnitude of the remanence, whose orientation may also differ by a few degrees relative to its nominal easy axis.

The effect of the magnetization tolerances on the field inside the cavity may be greatly reduced because of statistical averaging of the random fluctuations of $\vec{J}_0$ over a large number of blocks. Moreover, a significant reduction of the field distortion may result from the insertion of the high permeability components inserted in the magnetic structure to offset the effect of the magnet opening. A high permeability plate acts as a shield or spatial filter to reduce the field distortion caused by a local perturbation of the remanence of the material. Thus the high permeability plates illustrates in the schematic of FIG. 16 has the additional beneficial effect of reducing the effect of magnetization tolerances, particularly if their dimensions are larger compared to the size of the individual blocks of magnetic material.

The filtering effect coupled with statistical averaging may be enough to satisfy the uniformity requirements in the majority of industrial applications. In NMR imaging, however, following the design of the magnetic structure above described, magnet shimming for compensation of fabrication tolerances must be necessary. Consider a fully assembled magnet that incorporates the compensation of the major causes of field distortion discussed above, and assume that a measurement of the field is performed over a sphere that includes the whole region of interest. (It is not necessary, in accordance with the invention, to employ a spherical surface for this purpose.) As shown in FIG. 24, $\rho_0$ is the radius of the sphere, whose center can be chosen for instance to coincide with the nominal center F of the field configuration. In practice, the mapping of the field on the sphere or other surface is done by measuring the components of the field intensity $\vec{H}$ rather than the scalar potential $\phi$. In the case of a highly uniform field dominant component of $\vec{H}$ within the sphere is oriented along the axis y, as indicated by the heavy arrows of FIG. 24. Then the mapping of the magnitude of $\vec{H}$ can be obtained by the measurements of the $H_y$ component only without any appreciable error.

Assume that $H_y$ is measured over a large number of points $P_h$ of the sphere whose position is determined by the angular coordinates $\theta_h$, $\Psi_h$ in a spherical frame of reference $\rho$, $\theta$, $\Psi$ used for the field mapping as indicated in the schematic of FIG. 24. Let $(H_y)_{avg}$ be the average of the measured values over the sphere. At each point P one can define the y component of the field perturbation as $$\delta H_h = (H_y)_h - (H_y)_{avg} \tag{27}$$

Assume that points $P_k$ are projected from center O on a surface S that encloses the sphere (or other initially measured surface). In the ideal case of a closed cavity, S could be the same polyhedral surface of the cavity. As indicated in the schematic of FIG. 24 let Q be the projection of P on face $S_n$ of the polyhedron. The basic approach for the compensation of the magnetization tolerances is to locate at each point $Q_k$ a dipole moment $p_{k,j}$ such that the field generated by the distribution of dipoles on surface S cancels the perturbation $\delta H_h$ of the field of the magnet at each point $P_h$.

Assume at each point $Q_k$ of surface S a dipole oriented in the direction of the axis y, with a dipole moment equal to unity. The potential generated by the unit dipole at a point $P_h$ of the sphere of radius $\rho_0$ is $$\phi_{h,k}^{(1)} = -\frac{1}{4\pi\mu_0} \vec{y} \cdot \nabla_h \left( \frac{1}{\rho_{h,k}} \right) \tag{28}$$

where $\vec{y}$ is a unit vector oriented in the direction of the axis y, $\rho_{h,k}$ is the distance between points $Q_k$ and $P_h$, and the gradient of $\rho_{h,k}^{-1}$ is computed at point $P_h$. Assume that points $P_h$ coincide with the measuring points. The field perturbation $\delta H_h$ can be canceled at each point $P_h$ if moments $\vec{p}_k$ of the dipoles oriented in the direction of the axis y satisfy the system of equations $$\sum_{k=1}^{n_0} H_{h,k}^{(1)} p_k = -\delta H_h \tag{29}$$
$$(h = 1, 2, \ldots, N_0)$$

where $p_k$ is the nondimensional value of the moment of the dipole $\vec{p}_k$ and coefficients $H_{h,k}^{(1)}$ are the y components of the intensities generated by the unit dipoles at points $p_h$. The selection of the number $n_0$ of measuring points on the sphere of $$H_{h,k}^{(1)} = -\frac{\delta}{\delta y} \phi_{h,k}^{(1)} \tag{30}$$

radius $\rho_0$ is dictated by the condition that the difference between the values of the field perturbation at two adjacent points is small compared to the value of the perturbation at either point. The selection of the position of the correcting dipole relative to the measuring points on the sphere of radius $\rho_0$ is dictated by the condition that the correcting dipoles cancel the field perturbation at the measuring points without introducing an equally large or even larger perturbation at any other point of the sphere. For instance, if point $Q_k$ is infinitismally close to $P_h$, a dipole located at $Q_k$ that cancels the field perturbation at not only may be totally ineffective every place else but it may introduce higher order harmonics within the sphere of radius $\rho_0$. On the other end, the larger the distance of the correcting dipoles from the measuring sphere, the larger the dipole moment of each dipole is going to be in order to satisfy the system of equations 29. As the distance of the correcting dipoles from the measuring sphere or other measuring sphere increases, dipole moment $P_k$ must increase approximately as the cube of $\rho_{h,k}$, in order to generate the same field at point $P_h$.

Each correcting dipole can be implemented with a small block of magnetized material. The order of magnitude of the volume $V_k$ of each dipole is $$O(V_k) \approx \frac{p_k}{J_s} \tag{31}$$

where $J_s$ is the remanence of the dipole material. Hence the volume $V_k$ also increase with the cube of distance $\rho_{h,k}$. The optimum position of the dipole is finally dictated by the available space within and without the magnet cavity. In particular, because of the transparency of the magnetic structure, the shimming a yokeless magnet can be can be performed with correcting dipole outside of the magnets.

The final shimming of a magnet may involve a sequence of converging steps. After installing the correcting dipoles computed with the system of equations 27, a new measurement of the field is performed to determine the new value of the field perturbation at the sampling points $P_h$. Then, by means of the same system of equations 27, the values are used to determine the additional correction of the dipole distribution. This second correction may be implemented in several ways by adding additional blocks of magnetized material and, or changing the orientation of dipoles $\vec{p}_k$ wherever possible.

It is of importance to point out that a total cancellation of the field perturbation can never be achieved, regardless of the distribution of the correcting dipoles. At best the shimming procedure may yield a degree of field uniformity equal or better than what is required for a specific application. The limitation of the shimming procedure is due to the fact that, as the magnet is open to the surrounding medium, the correcting dipoles are also distributed on a surface S that cannot be closed and the opening of S determines the limit of the correction that can be achieved.

In the schematic of FIG. 25, $A_0$ denotes the area of the opening of the magnet of length $2z_0$. The part of the magnetic structure missing within the solid angle $\Omega_0$, subtended by area $A_0$ from center O of the magnet, determines the spectrum of the high order spatial harmonics of the field distortion caused by the magnet opening.

In the case of a yokeless magnet, the correcting dipoles can be located outside of the magnetic structure, and, as a consequence, they can be distributed over a length $2z_s > 2z_0$ of the cylinder of cross-section $A_0$, as schematically indicated in FIG. 25. The effect of this extended distribution of the dipoles is equivalent to a lengthening of the magnet, with the result of improving the field uniformity by shifting the spectrum of the field distortion towards higher order harmonics.

The techniques discussed above enable the magnet designer to compensate for the field distortion caused by actual characteristics of magnetic materials and changes of the magnet geometry dictated by the requirements of individual applications. The types of compensating techniques described are applicable as long as they are intended to correct relatively small distortions of the field within the region of interest. This is the case when the magnetic materials exhibit quasi-linear characteristics and the departure of the magnet geometry from an ideal closed structure does not affect in a substantial way the field within the region of interest. If, on the other hand, a major correction of the field is required, a large compensating structure would have to be added to the magnet which is equivalent to say that the magnet should be redesigned to meet the design requirements. For instance, if a magnet is designed on the basis of an open section of finite length of a two-dimensional structure, one cannot expect to start the design by choosing a length of the magnet short compared to the dimensions of the region of interest and then assume to be able to regenerate the field uniformity by means of other techniques. Such a short magnet would lose completely the properties that characterize the structures described above. As previously stated, the size of a magnet opening is the most important factor to be considered in the initial selection of the magnet geometry, and its effect could be reduced to any desired level, as long as the magnetic structure is large enough. In practice, the initial selection of the magnet dimensions will result from a trade off of several factors, including cost and complexity of the compensating techniques. As indicated by FIGS. 9 and 20, an initial distortion of the field within the region of interest of the order of 1% can be reduced by one or two orders of magnitude to a level of the order of $10^2$ ppm by means of the techniques described above. Typically, one can expect such a level of field uniformity in the random pattern of the field caused by the magnetization tolerances in a structure composed of a large number of individual blocks of magnetic material.

As a consequence, a uniformity of the order of $10^2$ ppm may be considered as the limit of the field correction that the magnet designer may want to achieve in the design phase. Any improvement beyond this point should be left to a final adjustment of the magnet structure as discussed with reference to FIGS. 24 and 25.

In the process of deriving the locations magnitudes of magnets for shimming the magnetic structure, the scalar potential $\Phi$ is equal to $$\Phi = \frac{1}{4\pi\mu_0} \sum_l \sum_{j=1}^{l} f_{l,1}^{(l)} \rho^l P_j^l(\cos\theta)\cos j\Psi$$

where $\mu_0$ is equal to $4\pi \cdot 10^{-7}$ Henry/meter, $\rho$ is the distance from the center of the magnet $P_j^l$ is the associated Legendre's junction, and $\Theta$ and $\Psi$ are the angles with respect to the z and x directions as illustrated in FIG. 25. The quantity $q_{j,1}^{(l)}$ is the coefficient of the jth symmetric harmonic $\Phi$ and the lth harmonic in $\Theta$, and is equal to $$q_{j,1}^{(l)} = \sum_{i=1}^{N} q_{1,j,i}^{(l)}$$

and $$q_{i,j,1}^{(l)} = 2\frac{(l-j)!}{(l+j)!} \int_{S_i} \frac{\sigma_1}{\rho_i^{(l+1)}} P_j^l(\cos\theta_i)\cos j\Psi_i dS_i$$

where $\sigma$ is the surface charge at the interface and S is the surface on which the point Ph is projected. The surface charge $\sigma$ is:

$$\sigma_i = (\vec{J}_h - \vec{J}_k)\cdot\vec{n}_i$$

where the vectors $J_h$ and $J_k$ are the remanences of the two magnets at the interface and n is $$dS_i = ds_i dz$$

where z is the length of the magnet, and $$q_{i,j,1}^{(l)} = 2\frac{(l-j)!}{(l+j)!} \int_{s_i} ds_i \int_{-z_0}^{+z_0} \frac{\sigma_1}{\rho_i^{(l+1)}} P_j^l(\cos\theta_i)\cos j\Psi_i dz_i$$

The right hand quantity being the contribution of all of the interfaces. Accordingly, $$q_{j,1}^{(l)} = \int_{-z_0}^{+z_0} F_{l,i}(z)J(z)dz$$

since $$J(z) = J_0 + J_1(z)$$

then $$q_{j,1}^{(l)} = J_0 \int F_{l,i}(z)dz + \int F_{l,i}(z)J_1(z)dz$$

and $$q_{j,1}^{(l)} = [q_{j,1}^{(l)}] + \int F_{l,i}(z)J_1(z)dz = 0$$

In this equation, the first term is the original and the last term is the modulation term. l and j are each not equal to 1. Accordingly, $$\int F_{l,i}(z)J_i(z)dz = -[q_{l,i}^{(1)}]_0$$

The controlling equation for determining the number of modulations $$c_{l,j,m}J_m = -[q_{j,1}^{(l)}]_0$$
$$c_{l,i,m} = F_{l,j}(z)dz_m$$
$$a_{l,j,m}dz_m = -[q_{j,1}^{(l)}]_0$$
$$a_{l,j,m} = F_{l,i}(z_m)J_m$$

While the invention has been disclosed and described with reference to a limited number of embodiments, it will be apparent that variations and modifications may be made therein, and it is therefore intended in the following claims to cover each such variation and modification as falls within the true spirit and scope of the invention.

What is claimed is:

1. In a magnetic structure having first and second spaced apart magnetized elements having surfaces in a common plane that define a wall of a cavity, said cavity having at least one opening, the space between said first and second magnetized elements comprising a slit extending perpendicularly to said plane for compensating for field distortion resulting from the provision of said opening; the improvement comprising a third magnetized element in said slit, said third element having a remanence that is different from the remanences of said first and second elements and that extends perpendicular to said plane.

2. The magnetic structure of claim 1 wherein the first and second magnetized elements have the same remanence extending in a direction perpendicular to said plane.

3. The magnetic structure of claim 1 wherein the first and second magnetized elements have different remanences extending in a direction perpendicular to said plane.

4. The magnetic structure of claim 1 wherein the third magnetized element has a remanence that is greater than that of said first and second magnetized elements.

5. The magnetic structure of claim 1 wherein the third magnetized element has a remanence that is less that that of said first and second magnetized elements.

6. In a magnetic structure having first, second and third spaced apart magnetized elements having surfaces in a common plane that define a wall of a cavity, the first, second and third magnetized elements having the same remanence extending in a direction perpendicular to said plane, said cavity having at least one opening, the spaces between said first, second and third magnetized elements comprising first and second slits extending perpendicularly to said plane for compensating for field distortion resulting from the provision of said opening; the improvement comprising fourth and fifth magnetized elements in said first and second slits, respectively, said fourth and fifth elements having remanences that are different from the remanences of said first, second and third elements and that extend perpendicular to said plane.

7. The magnetic structure of claim 6 wherein said first and second slits are positioned symmetrically in said structure in the direction perpendicular to said slits.

8. The magnetic structure of claim 6 wherein said second element is positioned between said first and third elements, whereby said first element has a first surface parallel to said first space on the side of said first element away from said first space, said third element has a second surface parallel to said second space on the side of said third element away from said second space, and said first and second spaces are symmetrical with respect to said first and second surfaces.

9. In a magnetic structure having first and second spaced apart magnetized elements having surfaces in first and second parallel planes defining walls of a cavity, the first and second magnetized elements having the remanences extending in a direction perpendicular to said planes; the improvement comprising means in said cavity for compensating for field distortion, said field distortion compensating means comprising a means having a high magnetic permeability positioned in said cavity and extending generally parallel to and adjacent one of said first and second planes, said high magnetic permeability means having a dimension, in the direction perpendicular to said first and second planes, that varies in the direction parallel to said first and second planes.

10. The magnetic structure of claim 9 wherein said high permeability means comprises a single plate.

11. The magnetic structure of claim 10 wherein said single plate has a thickness that varies in the direction parallel to said first and second planes.

12. The magnetic structure of claim 9 wherein said high permeability means comprises a plurality of plates.

13. The magnetic structure of claim 12 wherein said plurality of plates comprise a first plate adjacent one of said walls and having a first predetermined length, and at least one second plate on the side of said first plate away from said one wall, said second plate having a length shorter than said first wall.

14. The magnetic structure of claim 13 wherein said second plate is parallel to and spaced from said first plate.

15. The magnetic structure of claim 13 wherein said second plate extends perpendicular to said first and second planes.

16. The magnetic structure of claim 15 wherein said second plate abuts said first plate.

17. In a magnetic structure having first and second spaced apart magnetized elements having surfaces in first and second parallel planes to define walls of a cavity, the first and second magnetized elements having remanences extending in a direction perpendicular to said planes; the improvement comprising means in said cavity for compensating for field distortion, said field distortion compensating means comprising a plurality of flat plates of high magnetic permeability positioned in said cavity and extending parallel to and being symmetrically placed with respect to said first and second planes, said plates including first plates adjacent each of said first and second planes extending a predetermined distance along the walls of the cavity defined by the respective planes, and second plates spaced inwardly in said cavity of said first plates and extending a shorter distance than said predetermined distance, said second plates being arranged on opposite sides of the center of the respective cavity wall and being symmetrically positioned with respect to said center of the respective cavity wall.

18. The magnetic structure of claim 17 wherein said first predetermined distance is substantially coextensive with said wall.

19. In a magnetic structure having first and second spaced apart magnetized elements having surfaces in first and second parallel planes to define the walls of a cavity, the first and second magnetized elements having the remanences extending in direction perpendicular to said planes; the improvement comprising means in said cavity for compensating for field distortion, said field distortion compensating means comprising a pair of first flat plates of high magnetic permeability positioned in said cavity parallel to and symmetrically positioned with respect to said first and second planes, said first plates being adjacent each of said first and second planes and extending coextensively with the walls of the cavity defined by the respective planes, and second plates abutting said first plates and being directed inwardly in said cavity, said second plates being arranged on opposite sides of the center of the respective cavity wall and being symmetrically positioned with respect to said center of the respective cavity wall.

20. In a yokeless magnetic structure having magnetized elements defining a cavity, the cavity having first and second walls extending in parallel planes, the magnetized elements defining a field in said cavity that extends perpendicular to said first and second walls, said cavity having a central axis intermediate said first and second walls; the improvement comprising means positioned externally of said cavity for compensating for field distortion, said field distortion compensating means comprising first and second elements of magnetized material positioned on opposite sides of said magnetic structure, at said axis, the remanence of said first and second elements extending in a direction to produce a field in said cavity that compensates for field distortion in of the field produced said cavity by said magnetic structure.

21. The yokeless magnetic structure of claim 20 wherein said cavity has a central axis and said first and second elements of magnetized material are positioned on said axis.

22. The yokeless magnetic structure of claim 20 wherein the remanence of said first and second elements extend opposite to the direction of the field in said cavity produced by said magnetic structure.

* * * * *